United States Patent
Akiyoshi et al.

(10) Patent No.: US 12,451,355 B2
(45) Date of Patent: Oct. 21, 2025

(54) METHOD OF MANUFACTURING SEMICONDUCTOR DEVICE AND SEMICONDUCTOR MANUFACTURING APPARATUS

(71) Applicant: Mitsubishi Electric Corporation, Tokyo (JP)

(72) Inventors: Kyohei Akiyoshi, Tokyo (JP); Atsushi Yoshida, Tokyo (JP); Yosuke Nakanishi, Tokyo (JP); Shinichiro Katsuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 536 days.

(21) Appl. No.: 17/830,069

(22) Filed: Jun. 1, 2022

(65) Prior Publication Data

US 2023/0036107 A1    Feb. 2, 2023

(30) Foreign Application Priority Data

Jul. 27, 2021    (JP) .................................. 2021-122358

(51) Int. Cl.
    *H01L 21/04*    (2006.01)
    *H10D 12/01*    (2025.01)
    (Continued)

(52) U.S. Cl.
    CPC ......... *H01L 21/049* (2013.01); *H10D 12/031* (2025.01); *H10D 62/8325* (2025.01);
    (Continued)

(58) Field of Classification Search
    CPC ............. H01L 29/66068; H01L 29/401; H01L 21/049; H10D 12/031; H10D 62/8325; H10D 64/01
    See application file for complete search history.

(56) References Cited

U.S. PATENT DOCUMENTS

| | | | | |
|---|---|---|---|---|
| 6,066,508 A | * | 5/2000 | Tanabe | B01D 53/8671 |
| | | | | 423/248 |
| 8,268,731 B2 | * | 9/2012 | Nakamura | H01L 21/31662 |
| | | | | 438/770 |

(Continued)

FOREIGN PATENT DOCUMENTS

| | | | | |
|---|---|---|---|---|
| CN | 1236186 A | * | 11/1999 | ......... H10D 84/0181 |
| CN | 114846587 A | * | 8/2022 | ............. C23C 16/52 |

(Continued)

OTHER PUBLICATIONS

An Office Action; "Notice of Reasons for Refusal," mailed by the Japanese Patent Office on Jun. 4, 2024, which corresponds to Japanese Patent Application No. 2021-122358 and is related to U.S. Appl. No. 17/830,069; with English language translation.

(Continued)

*Primary Examiner* — Laura M Menz
(74) *Attorney, Agent, or Firm* — Studebaker Brackett PLLC

(57) ABSTRACT

Provided is a method of manufacturing a semiconductor device capable of suppressing variation in thickness of oxide films among a plurality of SiC wafers. Forming first inorganic films on lower surfaces of a plurality of SiC wafer, and then performing etching of the plurality of SiC wafers so that 750 nm or more of the first inorganic film is left in thickness, and then forming oxide films on upper surfaces of the plurality of SiC wafers by performing thermal oxidation treatment in a state in which a first SiC wafer of the plurality of SiC wafers is placed directly below any one of at least one wafer, including at least one of a dummy wafer and a monitor wafer, and a second SiC wafer of the plurality of SiC wafers is placed directly below a third SiC wafer of the plurality of SiC wafers.

4 Claims, 16 Drawing Sheets

(51) Int. Cl.
*H10D 62/832* (2025.01)
*H10D 64/01* (2025.01)
*H01L 21/311* (2006.01)
*H10D 30/66* (2025.01)

(52) U.S. Cl.
CPC ........ *H10D 64/01* (2025.01); *H01L 21/31111* (2013.01); *H10D 30/66* (2025.01)

(56) References Cited

U.S. PATENT DOCUMENTS

| | | | | |
|---|---|---|---|---|
| 8,303,797 | B2 * | 11/2012 | Hayamizu | C25B 1/30 205/471 |
| 9,039,411 | B2 * | 5/2015 | Kadobe | C23C 16/303 432/247 |
| 9,293,543 | B2 * | 3/2016 | Azumo | H01L 21/022 |
| 9,455,197 | B2 * | 9/2016 | Yuki | H10D 84/0144 |
| 11,688,621 | B2 * | 6/2023 | Curry | H01L 21/67754 414/787 |
| 2004/0043617 | A1 | 3/2004 | You et al. | |
| 2006/0027171 | A1 * | 2/2006 | Hsu | H01L 21/67309 118/728 |
| 2007/0231757 | A1 * | 10/2007 | Dip | C30B 31/16 431/174 |
| 2008/0110766 | A1 * | 5/2008 | Hayamizu | C25B 1/30 204/263 |
| 2008/0299739 | A1 * | 12/2008 | Yoshizawa | H01L 21/02164 438/424 |
| 2009/0305512 | A1 | 12/2009 | Matsuura et al. | |
| 2010/0029092 | A1 * | 2/2010 | Nakamura | H01L 21/02238 438/770 |
| 2010/0144161 | A1 * | 6/2010 | Nakamura | C30B 33/005 438/767 |
| 2012/0000425 | A1 * | 1/2012 | Park | H01L 21/67309 118/724 |
| 2012/0231407 | A1 * | 9/2012 | Kadobe | F27B 17/0025 432/247 |
| 2012/0260857 | A1 * | 10/2012 | Takahashi | C23C 16/45563 118/725 |
| 2014/0094027 | A1 * | 4/2014 | Azumo | H10D 64/01 118/715 |
| 2014/0242815 | A1 * | 8/2014 | Tanioka | H01L 29/66068 438/795 |
| 2016/0245704 | A1 * | 8/2016 | Osaka | G01K 1/14 |
| 2022/0148899 | A1 * | 5/2022 | Gao | H01L 21/67309 |
| 2022/0356580 | A1 * | 11/2022 | Okajima | H01L 21/67757 |
| 2023/0036107 | A1 * | 2/2023 | Akiyoshi | H01L 21/049 |
| 2024/0254630 | A1 * | 8/2024 | Tateno | H01L 21/02255 |

FOREIGN PATENT DOCUMENTS

| | | | | |
|---|---|---|---|---|
| CN | 115692171 | A * | 2/2023 | H10D 64/01 |
| CN | 117836915 | A * | 4/2024 | H01L 21/67248 |
| DE | 102013225320 | B4 * | 6/2019 | H01L 21/324 |
| DE | 102022118209 | A1 * | 2/2023 | H10D 64/01 |
| JP | H05166741 | A * | 7/1993 | C23C 16/4583 |
| JP | 2004343094 | A * | 12/2004 | |
| JP | 2010114188 | A * | 5/2010 | |
| JP | 2011-187884 | A | 9/2011 | |
| JP | 2013-197116 | A | 9/2013 | |
| JP | 2014075451 | A * | 4/2014 | H10D 30/0297 |
| JP | 2014-165348 | A | 9/2014 | |
| JP | 5702657 | B2 * | 4/2015 | C23C 16/303 |
| JP | 2016115860 | A * | 6/2016 | H10D 62/8325 |
| JP | 6042160 | B2 * | 12/2016 | H10D 30/0297 |
| JP | 6080451 | B2 * | 2/2017 | H01L 21/67248 |
| JP | 6141130 | B2 | 6/2017 | |
| JP | 2021-015870 | A | 2/2021 | |
| JP | 2023018322 | A * | 2/2023 | H10D 64/01 |
| JP | 7565885 | B2 * | 10/2024 | H10D 64/01 |
| KR | 20070120055 | A * | 12/2007 | C25B 1/30 |
| KR | 2009110625 | A * | 10/2009 | |
| KR | 20140043879 | A * | 4/2014 | H10D 30/0297 |
| KR | 101710944 | B1 * | 2/2017 | C23C 16/45563 |
| KR | 20170083188 | A * | 7/2017 | H01L 21/67313 |
| KR | 102117127 | B1 * | 5/2020 | H10D 30/0297 |
| KR | 20240038021 | A * | 3/2024 | H01L 21/67248 |
| TW | 202205476 | A * | 2/2022 | C23C 16/52 |
| TW | 1792196 | B * | 2/2023 | C23C 16/52 |
| TW | 202314910 | A * | 4/2023 | H01L 21/67248 |
| TW | 1850707 | B * | 8/2024 | H01L 22/12 |
| WO | WO-2004095559 | A1 * | 11/2004 | H01L 21/31116 |
| WO | WO-2006106859 | A1 * | 10/2006 | H01L 21/02238 |
| WO | WO-2017218162 | A1 * | 12/2017 | C10G 1/10 |
| WO | WO-2020194414 | A1 * | 10/2020 | C23C 16/46 |
| WO | WO-2021156987 | A1 * | 8/2021 | C23C 16/4584 |
| WO | WO-2021176505 | A1 * | 9/2021 | C23C 16/52 |
| WO | WO-2023047552 | A1 * | 3/2023 | H01L 21/67248 |

OTHER PUBLICATIONS

An Office Action issued by the German Patent and Trademark Office on Jun. 15, 2023, which corresponds to German Patent Application No. 102022118209.6 and is related to U.S. Appl. No. 17/830,069; with English language translation.

An Office Action issued by the German Patent and Trademark Office on Jun. 25, 2025, which corresponds to German Patent Application No. 102022118209.6 and is related to U.S. Appl. No. 17/830,069; with English language translation.

\* cited by examiner

F I G. 1 2
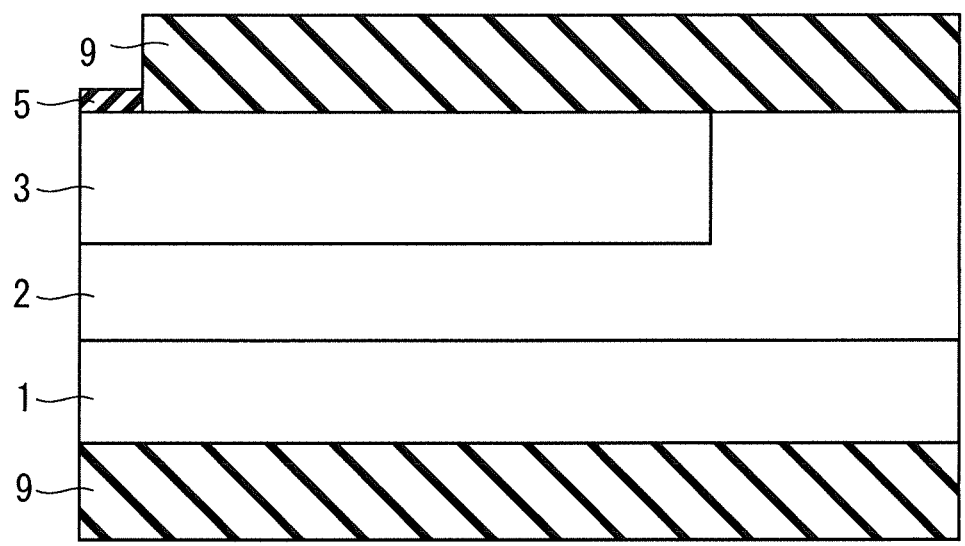
F I G. 1 3
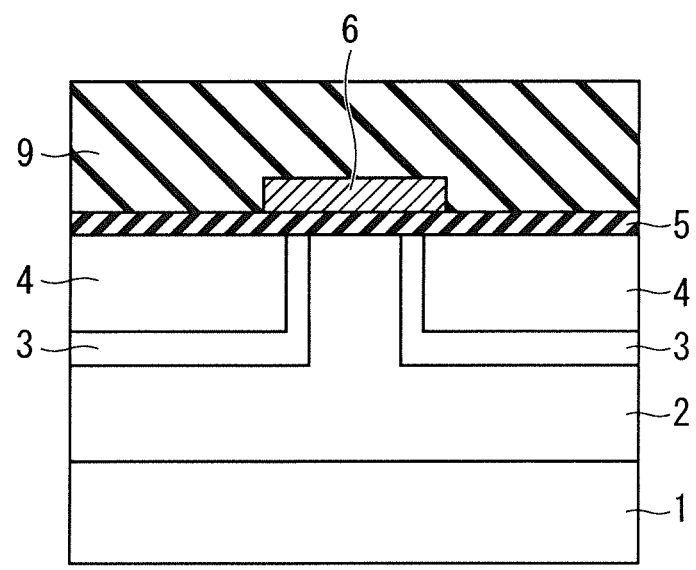

F I G. 1 6
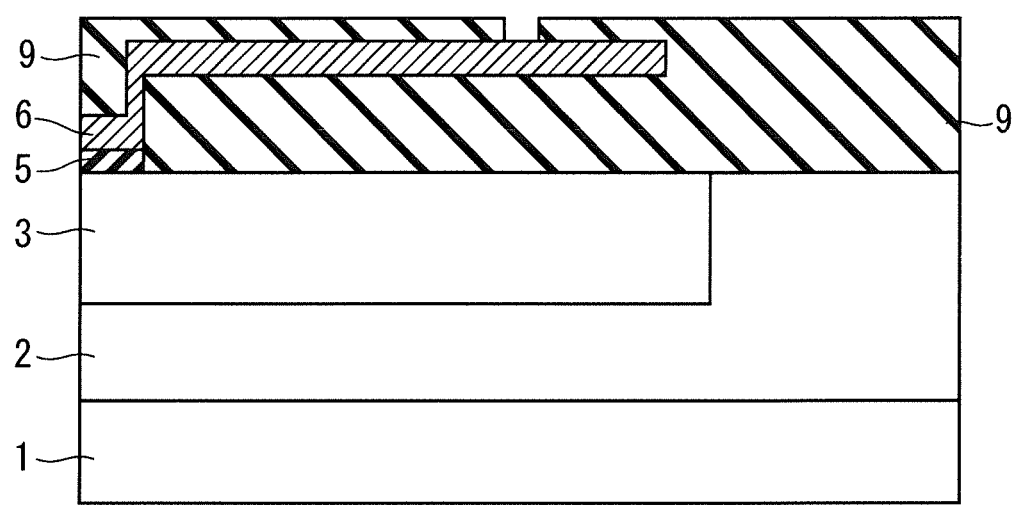

F I G. 1 8
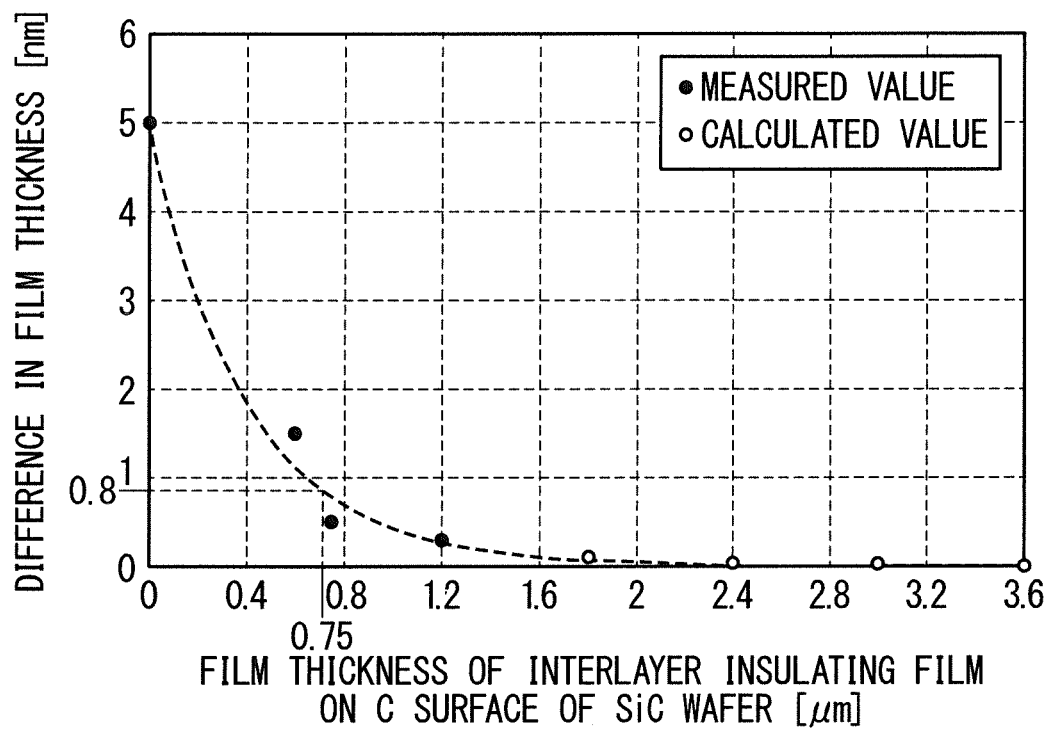

F I G. 1 9
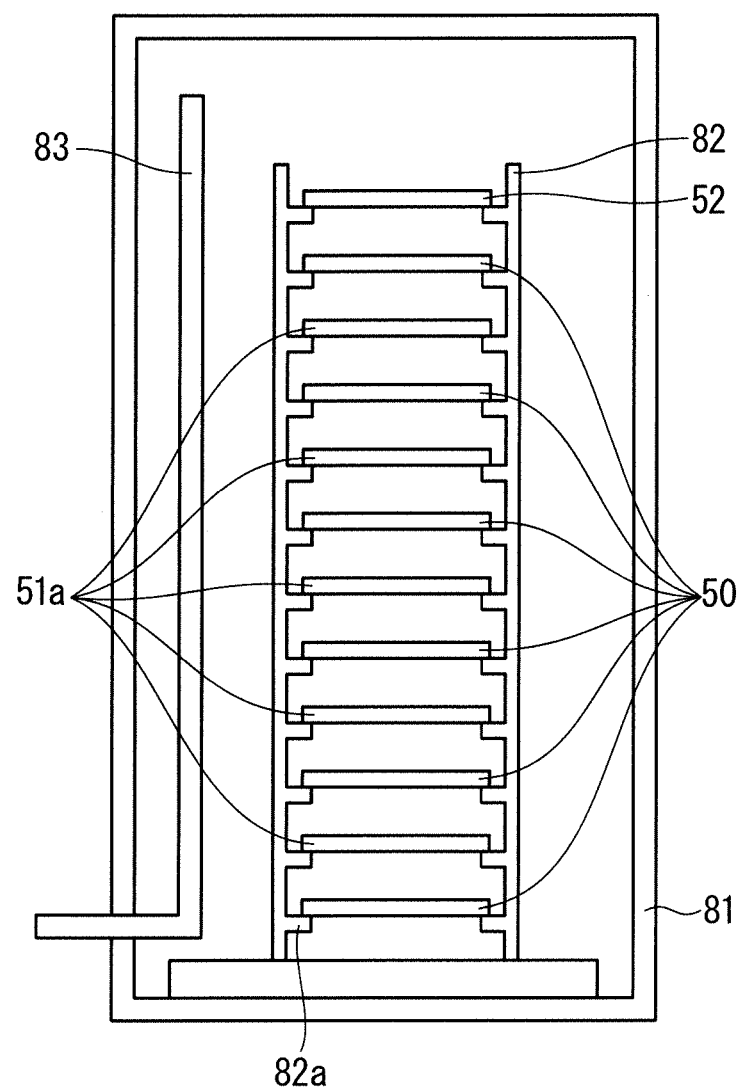

METHOD OF MANUFACTURING SEMICONDUCTOR DEVICE AND SEMICONDUCTOR MANUFACTURING APPARATUS

BACKGROUND OF THE INVENTION

Field of the Invention

The present disclosure relates to a method of manufacturing a semiconductor device and a semiconductor manufacturing apparatus.

Description of the Background Art

In Japanese Patent Application Laid-Open No. 2014-165348 and Japanese Patent No. 6141130, a procedure for suppressing variation in thickness of oxide films among a plurality of silicon carbide (hereinafter, also referred to as SiC) wafers when the oxide films are formed on the plurality of SiC wafers is disclosed.

The procedure in the prior art is not necessarily sufficient as a procedure for suppressing the variation in thickness of the thermal oxide films among a plurality of SiC wafers.

SUMMARY

Provided is a method of manufacturing a semiconductor device capable of suppressing variation in thickness of oxide films among a plurality of SiC wafers.

According to the method of manufacturing a semiconductor device of the present disclosure, first inorganic films are formed on lower surfaces of a plurality of silicon carbide wafer, and etching of the plurality of silicon carbide wafers is performed after the formation of the first inorganic films. The etching is performed in a manner that 750 nm or more is left in thickness of the first inorganic films of the plurality of silicon carbide wafers after the etching. Oxide films is formed on upper surfaces of the plurality of silicon carbide wafers by performing thermal oxidation treatment using a semiconductor manufacturing apparatus, and the thermal oxidation treatment is performed in a state in which at least one wafer, which is including at least one of a dummy wafer and a monitor wafer and which is different from the plurality of silicon carbide wafers, and the plurality of silicon carbide wafers are aligned in one direction and the upper surfaces of the plurality of silicon carbide wafers are oriented in one direction. In the state of the thermal oxidation treatment, a first silicon carbide wafer of the plurality of silicon carbide wafers is placed directly below any one of the at least one wafer, and a second silicon carbide wafer of the plurality of silicon carbide wafers is placed directly below a third silicon carbide wafer of the plurality of silicon carbide wafers.

According to the present disclosure, a method of manufacturing semiconductor device capable of suppressing variation in thickness of oxide films among a plurality of SiC wafers is provided.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 12 is a cross-sectional view illustrating a state during manufacturing of the semiconductor device according to the first embodiment;

FIG. 13 is a cross-sectional view illustrating a state during manufacturing of the semiconductor device according to the first embodiment;

FIG. 16 is a cross-sectional view illustrating a state during manufacturing of the semiconductor device according to the first embodiment;

FIG. 18 is a graph illustrating the relationship between the thickness of an interlayer insulating film formed on a C surface of the SiC wafer and the variation in thickness of gate oxide films among the SiC wafers;

FIG. 19 is a diagram illustrating a placement of wafers in the second embodiment;

DESCRIPTION OF THE PREFERRED EMBODIMENTS

<Precursor Art>

Figure 1:
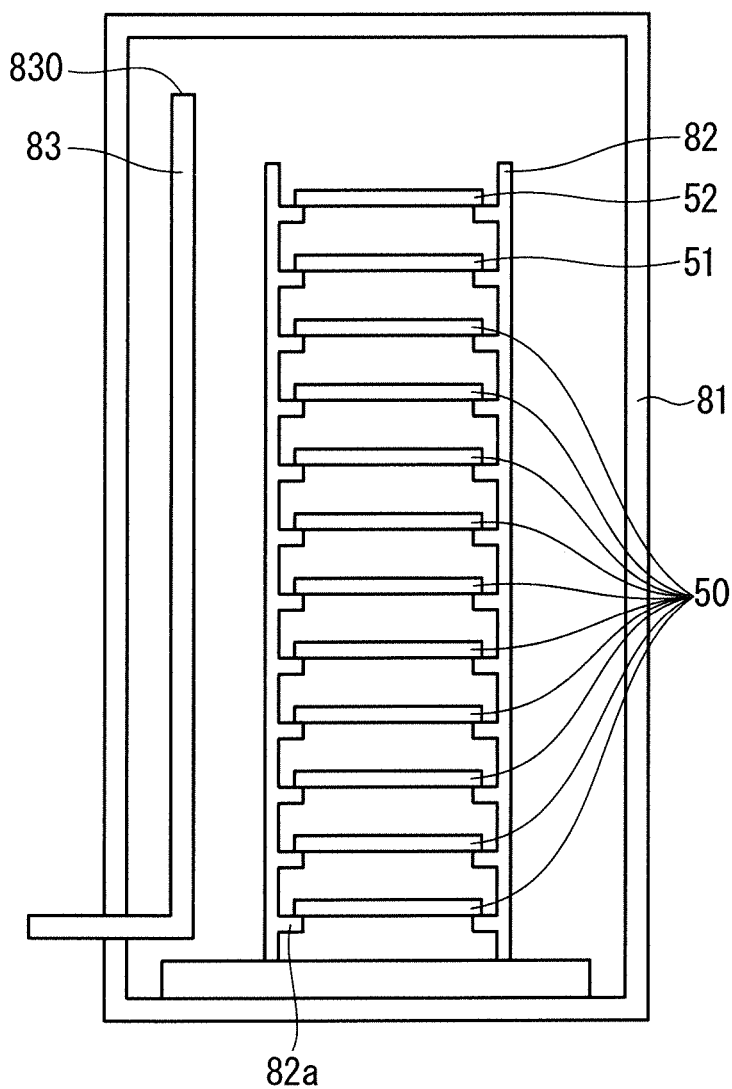
FIG. 1 is a diagram illustrating a batch type vertical diffusion furnace according to the first embodiment.

FIG. 1 is a diagram illustrating a configuration of a batch type vertical diffusion furnace 80, which is an example of a batch type vertical diffusion furnace used in each embodiment. In each embodiment described later, for example, the batch type vertical diffusion furnace 80 illustrated in FIG. 1 is used to form an oxide film on a SiC wafer 50 which is to be a silicon carbide semiconductor device.

The batch type vertical diffusion furnace 80 includes a tube 81, a boat 82 and a gas introduction line 83. The boat 82 includes a plurality of support portions 82a for supporting the wafers. The tube 81 is a container in which the thermal oxidation treatment is performed. In the batch type vertical diffusion furnace 80, a plurality of wafers are supported, by a plurality of support portions 82a, along one direction with the main surfaces of the plurality of wafers oriented in one direction.

As illustrated in FIG. 1, in the thermal oxidation treatment, the plurality of SiC wafers 50 are supported by the support portion 82a and placed in the tube 81 in a state of being spaced apart from each other. Hereinafter, a group of the plurality of SiC wafers 50 processed simultaneously in the batch type vertical diffusion furnace 80 is referred to as a batch. The gas introduction line 83 is a line for introducing an oxidizing gas into the tube 81. The gas introduction line 83 is provided with an opening 830, and the oxidizing gas is introduced into the tube 81 through the opening 830. The oxidizing gas is a gas used for thermal oxidation treatment, and is, for example, oxygen ($O_2$) gas or ozone ($O_3$) gas.

In the SiC wafer 50, for example, one main surface is a carbon (C) surface and the other main surface is a silicon (Si) surface.

FIG. 1 illustrates an example of the placement of the SiC wafers 50 when the thermal oxidation treatment is performed.

Each SiC wafer 50 is held on the boat 82 with the carbon (C) surface thereof facing downward and the silicon (Si) surface thereof facing upward. The SiC wafers 50 are stacked with a gap in a direction intersecting the main surface of the SiC wafer 50, for example, in a direction perpendicular to the main surface of the SiC wafer 50.

Before the thermal oxidation treatment, an inorganic film 90 (see FIGS. 2 and 3) is formed on a C surface 12 being the lower surface of each SiC wafer 50.

Over the SiC wafer 50 held on the top shelf of the SiC wafers 50, a SiC dummy wafer 51 is placed at a distance from the SiC wafer 50 on the top shelf. Over the SiC dummy wafer 51, a Si monitor wafer 52 is placed at a distance from the SiC dummy wafer 51.

Figure 2:
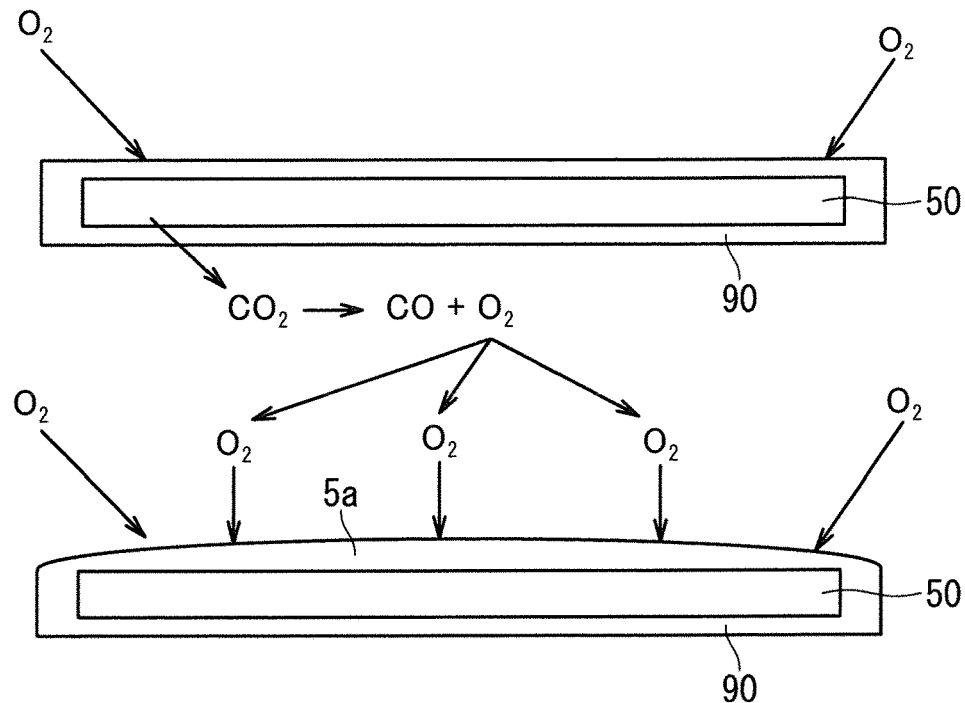
FIG. 2 is a cross-sectional view illustrating a state in the vicinity of a SiC wafer during thermal oxidation treatment.

Similar to the lower surface of the SiC wafer 50 in FIG. 2, an inorganic film 90 is formed on the lower surface of the SiC dummy wafer 51. The reason for placing the SiC dummy wafer 51 will be described later.

The thickness of the oxide film of the Si monitor wafer 52 is measured after the thermal oxidation treatment is completed; thereby, whether or not there is a problem with the oxide film formed on each SiC wafer 50 is confirmed.

When $O_2$ gas is used as the oxidizing gas, the thermal oxidation reaction in the SiC wafer 50 is estimated as illustrated in the following equation (1). In each of the following equations, "(↑)" represents that gas is generated.

$$SiC + 2O_2 = SiO_2 + CO_2(\uparrow) \tag{1}$$

As illustrated in the equation (1), in the thermal oxidation reaction in the SiC wafer 50, a silicon dioxide ($SiO_2$) film is formed and carbon dioxide ($CO_2$) gas is generated. The estimation in which the generated $CO_2$ gas is reversibly decomposed under the high temperature environment inside the tube 81 and causes the reaction represented by the following equation (2), so that carbon monoxide (CO) gas is discharged, and again, $O_2$ gas is generated is made.

$$2CO_2 = 2CO(\uparrow) + O_2(\uparrow) \tag{2}$$

Figure 3:
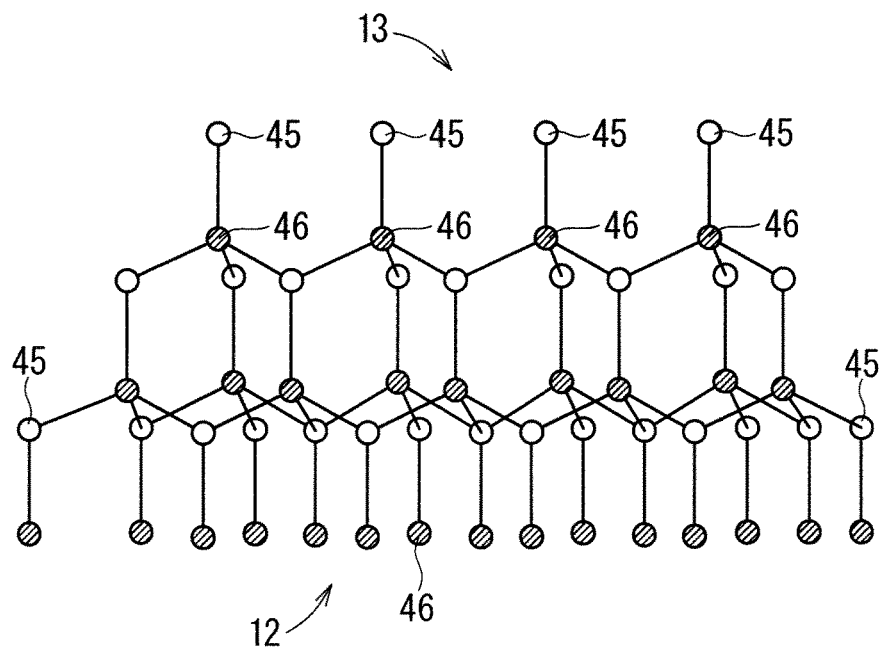
FIG. 3 is a diagram schematically illustrating a crystal structure of a SiC wafer.

FIG. 2 is a cross-sectional view illustrating a state in the vicinity of the SiC wafer 50 during thermal oxidation treatment. FIG. 3 is a diagram schematically illustrating a crystal structure of the SiC wafer 50.

As illustrated in FIG. 3, the crystal structure of the SiC wafer 50 is composed of silicon (Si) atoms 45 and carbon (C) atoms 46. One main surface of the SiC wafer 50 is the C surface 12 with the C atoms 46 exposed, and the other main surface is the Si surface 13 with the Si atoms 45 exposed.

As illustrated in FIG. 2, when $O_2$ gas is supplied to the SiC wafer 50 to form an oxide film 5a, $CO_2$ gas is generated due to the reaction of the equation (1). As illustrated in FIG. 3, the C surface 12 side of the SiC wafer 50 has more C atoms 46 than the Si surface 13 side does. Therefore, it is considered that the C surface 12 generates more $CO_2$ gas than the Si surface 13 does.

As described above, the inorganic film 90 is formed on the C surface 12 of the SiC wafer 50. The inorganic film 90 provided on the C surface 12 of the SiC wafer 50 has the effect of suppressing the reaction of the equation (1) on the C surface 12 of the SiC wafer 50. When the inorganic film 90 is thin, the effect of suppressing the reaction of the above-mentioned equation (1) is small, and therefore the degree of suppressing the reaction of the equation (2) is small, and the effect of increasing the oxygen concentration due to the equation (2) becomes large directly below the C surface 12 of the SiC wafer 50. Therefore, as illustrated in FIG. 2, when the C surface 12 of the SiC wafer 50 faces the Si surface 13 of the adjacent SiC wafer 50, it is considered that, in the SiC wafer 50 placed directly below the SiC wafer 50, the oxide film 5a, formed by the thermal oxidation treatment, becomes thicker. Further, the influence of oxygen generated due to the equation (2) differs depending on the position in the wafer surface, the degree of the oxidation reaction is non-uniform in the surface; therefore, it is considered that, in the SiC wafer 50 placed directly below the SiC wafer 50, the thickness of the oxide film 5a formed by the thermal oxidation treatment differs depending on the position in the plane.

In the placement illustrated in FIG. 1, consider a case where the inorganic film 90 formed on the C surface 12 of the SiC wafer 50 is thin and the SiC dummy wafer 51 is not placed between the Si monitor wafer 52 and the SiC wafer 50. That is, in FIG. 1, consider a case where a SiC wafer 50 is also placed at the position of the SiC dummy wafer 51. The reaction of the equation (1) does not occur in the Si monitor wafer 52; therefore, the reaction of the equation (2) and the generation of $O_2$ gas due to the presence of the Si monitor wafer 52 do not occur. In this case, in the SiC wafer 50 directly below the Si monitor wafer 52, the oxide film 5a formed by the thermal oxidation treatment is thinner than that in the case of the SiC wafer 50 directly below the SiC wafer 50. Accordingly, the thickness of the oxide film 5a formed on the upper surface of the SiC wafer 50 becomes non-uniform among the SiC wafers 50 in the batch.

By placing the SiC dummy wafer 51 having the inorganic film 90 formed on the C surface 12 between the Si monitor wafer 52 and the SiC wafer 50 as illustrated in FIG. 1, the thickness of the oxide film 5a formed by the thermal oxidation treatment is prevented from being non-uniform among the SiC wafers 50 in the batch.

An inorganic film 90 is formed on the C surface 12 of the SiC dummy wafer 51. The inorganic film 90 on the C surface 12 of the SiC dummy wafer 51 has the same thickness as the inorganic film 90 on the C surface 12 of the SiC wafer 50, for example. In this case, the same amount of $CO_2$ gas generated from the C surface 12 of the SiC wafer 50 is generated from the C surface 12 of the SiC dummy wafer 51, so that the thickness of the oxide film 5a formed by the thermal oxidation treatment can be prevented from being non-uniform among the SiC wafers 50 in the batch.

However, by repeatedly using the SiC dummy wafer 51, a thick thermal oxide film is formed on the C surface 12 of the SiC dummy wafer 51, and the inorganic film 90 becomes thicker. Therefore, the amount of $O_2$ gas generated from the C surface 12 of the SiC dummy wafer 51 is smaller than that from the C surface 12 of the SiC wafer 50. The oxide film 5a formed on the upper surface of the SiC wafer 50 directly below the SiC dummy wafer 51 by the thermal oxidation treatment is thinner than the oxide film 5a formed on the upper surface of the SiC wafer 50 directly below the SiC wafer 50 by the thermal oxidation treatment. As a result, the thickness of the oxide film 5a formed by the thermal oxidation treatment is non-uniform among the SiC wafers 50 in the batch.

As will be described later, in the methods of manufacturing the semiconductor devices of the first to fifth embodiments, the thick inorganic film 90 is formed on the C surface 12 of the SiC wafer 50 during the thermal oxidation treatment; therefore, the thickness of the oxide film 5a formed by the thermal oxidation treatment is prevented from being non-uniform among the SiC wafers 50 in the batch.

Although in the above description, the explanation was made based on the presumption that the reactions of the equations (1) and (2) occur, the effects of the methods of manufacturing the semiconductor devices of the first to fifth embodiments are not limited to the suppression the effects of the reactions of the equations (1) and (2). The atmosphere above a SiC wafer 50 may vary depending on whether the upper wafer of the SiC wafer 50 is the Si monitor wafer 52, the SiC dummy wafer 51, or the SiC wafer 50. In the methods of manufacturing semiconductor devices according to the first to fifth embodiments, the suppression of the thickness of the oxide film 5a formed by the thermal oxidation treatment from being non-uniform among the SiC wafers 50 in the batch depending on such a change in atmosphere is ensured.

A. First Embodiment

A-1. Configuration

With the method of manufacturing the silicon carbide semiconductor device of the first embodiment, for example, a MOSFET, a pn diode, a Schottky Barrier diode (SBD), a Bipolar Junction Transistor (BJT), a Junction FET (JFET), an Insulated Gate Bipolar Transistor (IGBT), or the like, is manufactured.

Figure 4:
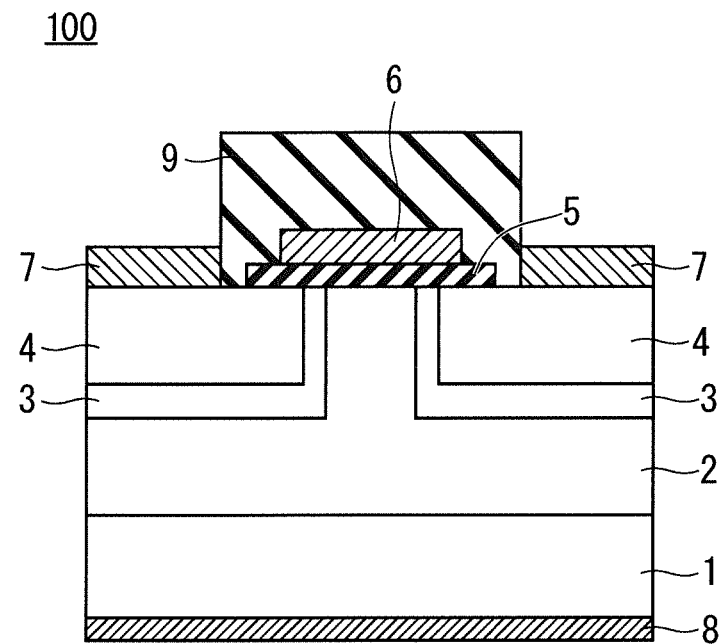
FIG. 4 is a diagram illustrating the inside of a cell of the semiconductor device according to the first embodiment.
Figure 5:
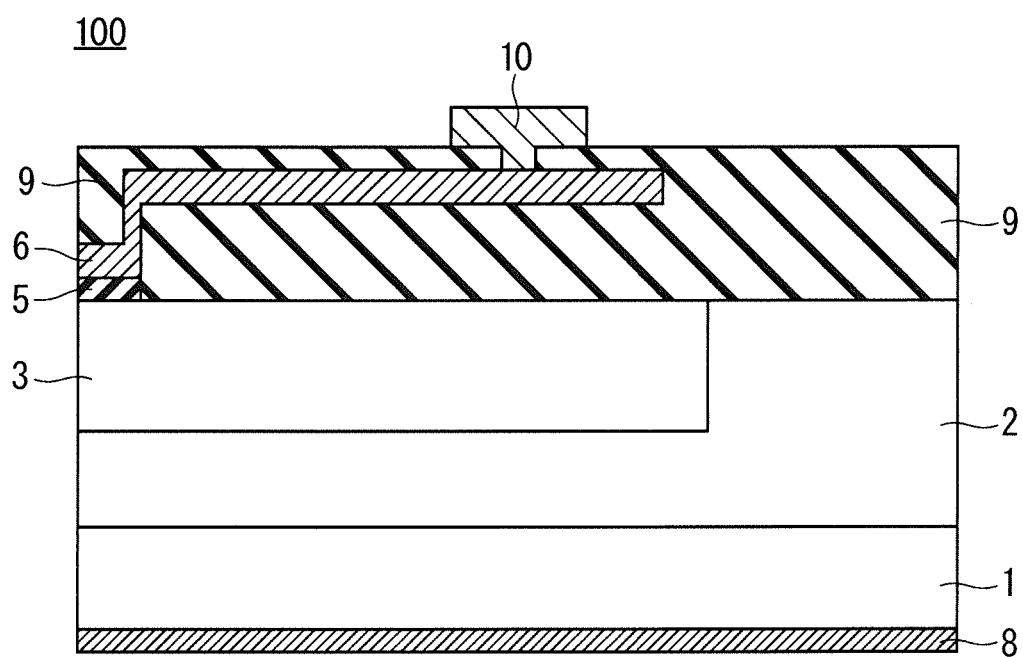
FIG. 5 is a diagram illustrating the outer periphery portion of the cell of the semiconductor device according to the first embodiment.

Hereinafter, the description is made in which a case where the semiconductor device manufactured by the method of manufacturing the silicon carbide semiconductor device of the first embodiment is a MOSFET 100 illustrated in FIGS. 4 and 5 is assumed. FIG. 4 illustrates the inside of the cell of MOSFET 100. FIG. 5 illustrates the outer periphery portion of the cell of MOSFET 100. In the following description, the conductive types of the semiconductor layers may be interchanged.

As illustrated in FIGS. 4 and 5, the MOSFET 100 includes a SiC substrate 1, a SiC drift layer 2, a base region 3, a source region 4, a gate oxide film 5, a gate wiring 6, a source electrode 7, a drain electrode 8, interlayer insulating film 9 and a gate electrode 10.

The upper surface of the SiC substrate 1 is an Si surface. The SiC substrate 1 is a single crystal n-type substrate having a crystal structure of 4H.

The SiC drift layer 2 is formed on the upper surface of the SiC substrate 1.

The base region 3 is selectively formed in the surface layer portion of the upper surface of the SiC drift layer 2. The base region 3 is a p-type semiconductor layer and contains, for example, aluminum (Al) as p-type impurities.

The source region 4 is selectively formed in the surface layer portion on the upper surface of the base region 3 inside the cell. The source region 4 is an n-type semiconductor layer. The source region 4 contains, for example, nitrogen (N) as n-type impurities.

The gate oxide film 5 is formed across on a region 2a interposed between two adjacent source regions 4 of the source region 4, the base region 3, and the SiC drift layer 2. The gate wiring 6 is formed on the gate oxide film 5. The drain electrode 8 is formed on the C surface which is the lower surface of the SiC substrate 1. The gate wiring 6 and the source electrode 7 are separated by the interlayer insulating film 9. The gate wiring 6 is drawn from the inside of the cell to the outer periphery of the cell, and is connected to the gate electrode 10 at the outer periphery of the cell.

Although the MOSFET 100 is illustrated as a planar gate structure in FIG. 4, the MOSFET 100 may be of a trench gate type.

A-2. Manufacturing Method

Figure 17:
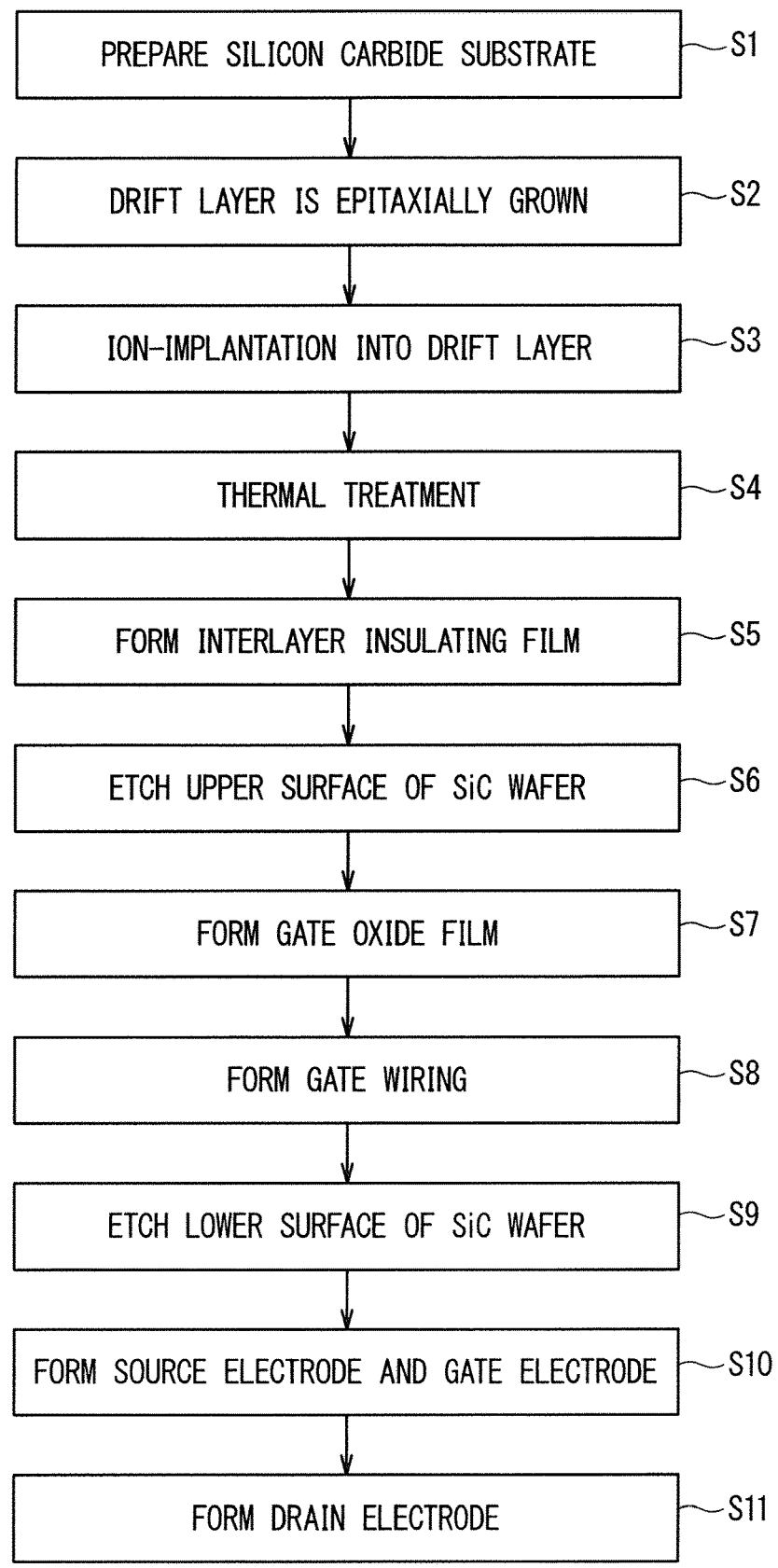
FIG. 17 is a flowchart of a method of manufacturing the semiconductor device according to the first embodiment.

FIG. 17 is a flowchart of a method of manufacturing the semiconductor device according to the first embodiment.

Figure 6:
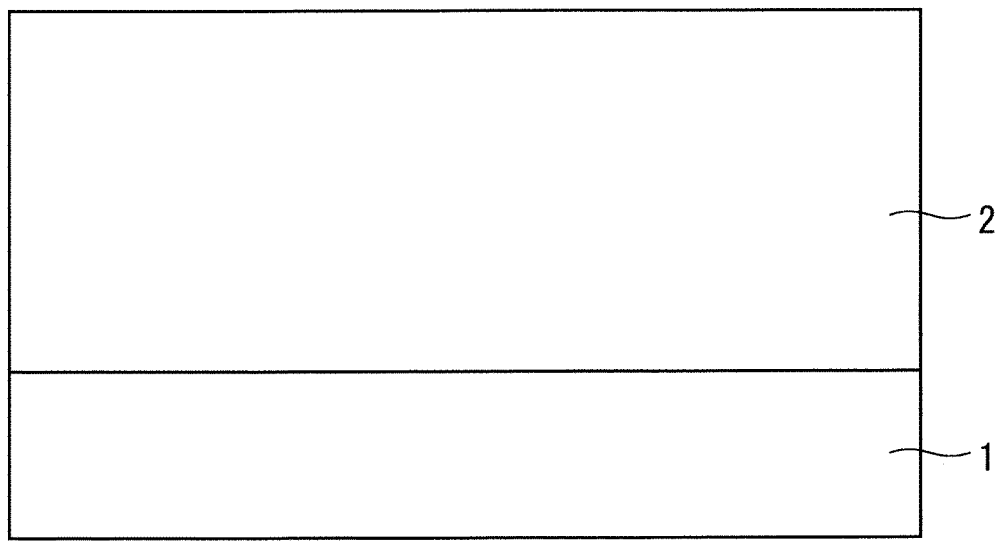
FIG. 6 is a cross-sectional view illustrating a state during manufacturing of the semiconductor device according to the first embodiment.

FIGS. 6 to 11 are cross-sectional views illustrating a state in which the MOSFET 100 is in the process of being manufactured. Hereinafter, the MOSFET manufacturing process will be described with reference to FIGS. 6 to 11. FIG. 6 is a diagram corresponding to both the inside of the cell and the outer periphery portion of the cell. FIGS. 7 to 9, 11, 13, and 15 are diagrams corresponding to the inside of the cell. FIGS. 10, 12, 14, and 16 are diagrams corresponding to the outer peripheral portion of the cell.

First, in Step S1, the silicon carbide substrate 1 is prepared.

Next, in Step S2, the SiC drift layer 2 is epitaxially grown on the upper surface of the silicon carbide substrate 1 by the CVD method (see FIG. 6). The concentration of the n-type impurities in the SiC drift layer 2 is $1\times10^{15}$ cm$^{-3}$ to $1\times10^{17}$ cm$^{-3}$, and the thickness thereof is 5 to 50 μm.

Figure 7:
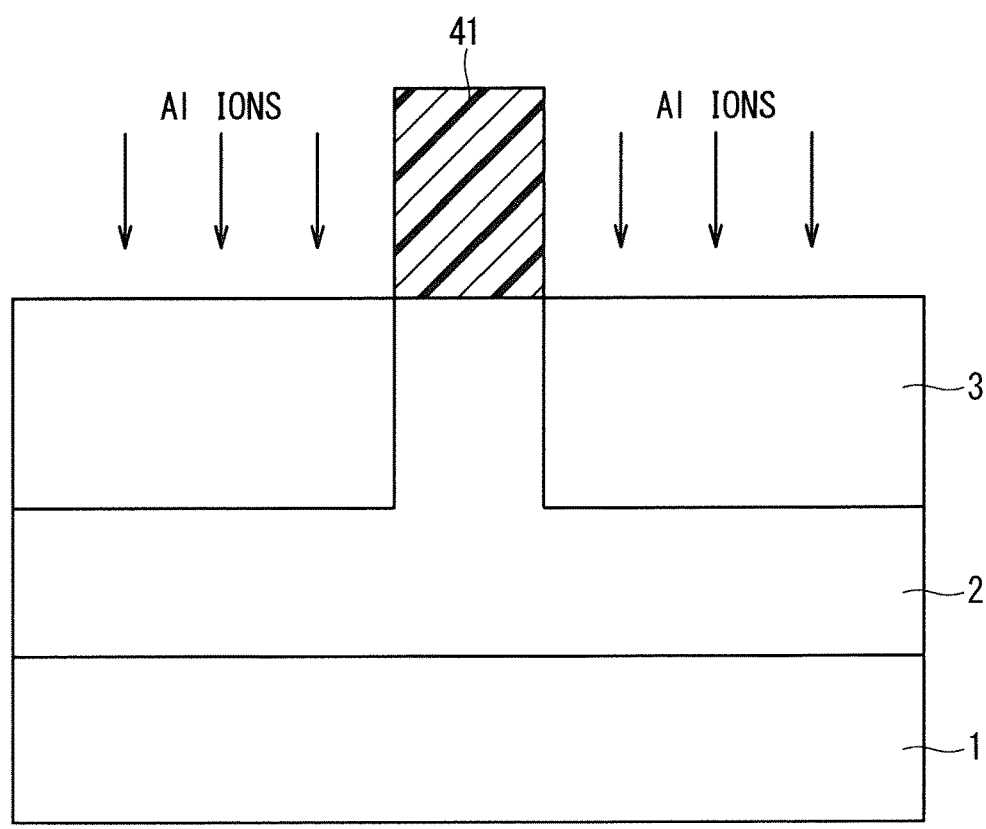
FIG. 7 is a cross-sectional view illustrating a state during manufacturing of the semiconductor device according to the first embodiment.

Next, in Step S3, a mask 41 is formed on the upper surface of the SiC drift layer 2, and Al, which are p-type impurities, are ion-implanted into the SiC drift layer 2 using the mask 41 (see FIG. 7). At this point, the depth of ion implantation of Al is about 0.5 to 3 μm, which does not exceed the thickness of the SiC drift layer 2. The impurity concentration of the ion-implanted Al is in the range of $1\times10^{17}$ cm$^{-3}$ to $1\times10^{19}$ cm$^{-3}$, which is higher than the n-type impurity concentration of the SiC drift layer 2. Of the SiC drift layer 2, the region where Al is ion-implanted and becomes p-type becomes the base region 3. After performing the ion implantation of Al, the mask 41 is removed.

Figure 8:
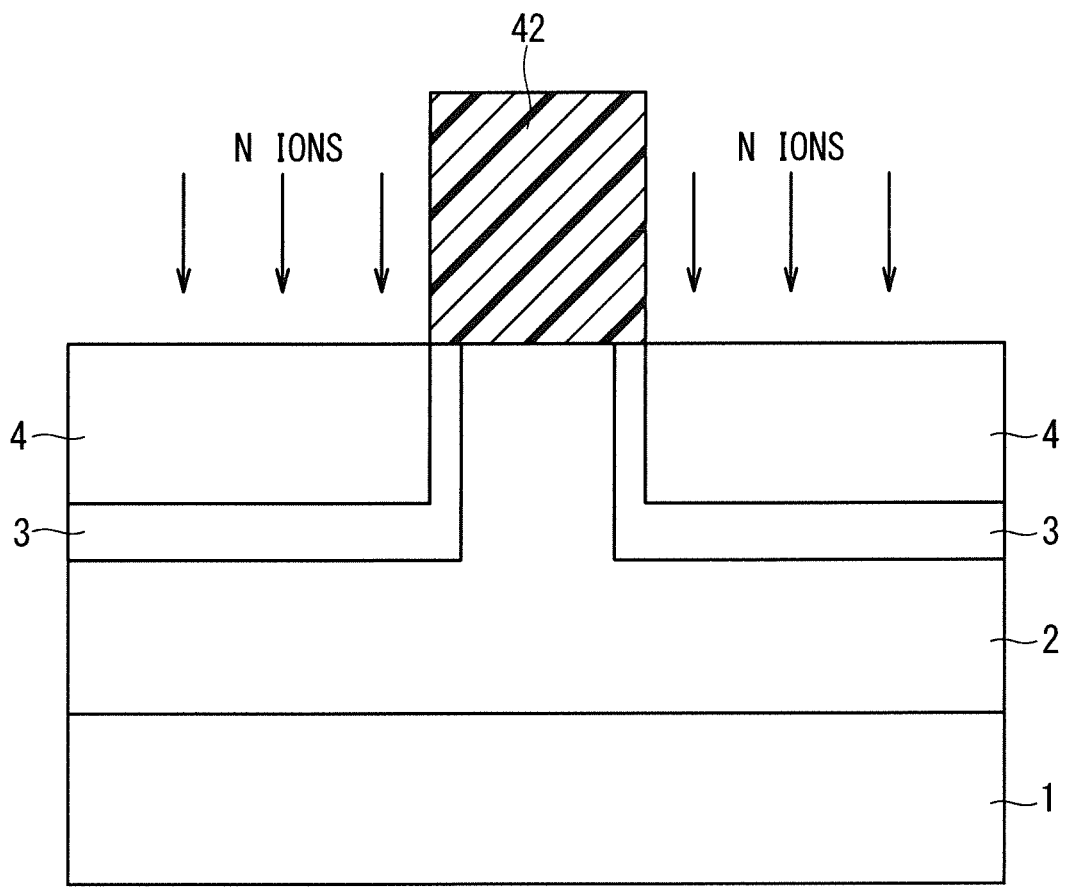
FIG. 8 is a cross-sectional view illustrating a state during manufacturing of the semiconductor device according to the first embodiment.

Further, in Step S3, after removing the mask 41, a mask 42 is formed on the upper surface of the SiC drift layer 2, and the mask 42 is used to ion-implant N, which is n-type impurities, into the surface layer portion of the SiC drift layer 2 (see FIG. 8). In Step S3, the region of the SiC drift layer 2 in which the Al ion has been previously injected in Step S3 and is also collectively referred to as the SiC drift layer 2. The depth of ion implantation of N is made shallower than the thickness of base region 3. The impurity concentration of N to be ion-implanted exceeds the p-type impurity concentration in the base region 3 in the range of $1\times10^{18}$ cm$^{-3}$ to $1\times10^{21}$ cm$^{-3}$. In the region in the SiC drift layer 2 into which N is injected, the region showing the n-type is the source region 4. After performing N-ion implantation, the mask 42 is removed.

Next, in Step S4, the N and Al ion-implanted in Step S3 are activated by performing annealing at 1300 to 1900° C. for 30 seconds to 1 hour in an atmosphere of an inert gas such as argon (Ar) gas by a heat treatment apparatus.

Figure 9:
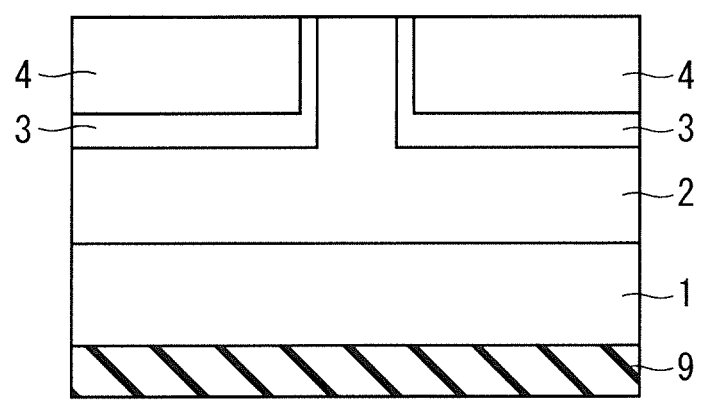
FIG. 9 is a cross-sectional view illustrating a state during manufacturing of the semiconductor device according to the first embodiment.
Figure 10:
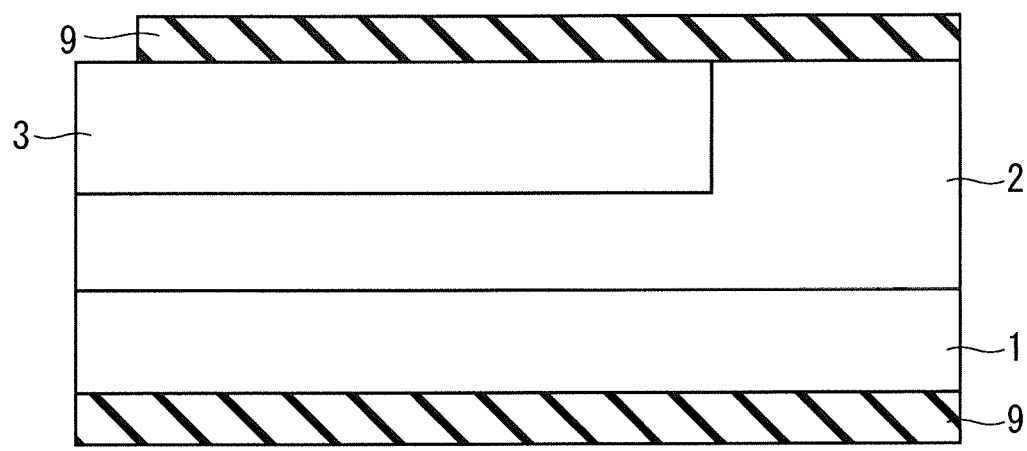
FIG. 10 is a cross-sectional view illustrating a state during manufacturing of the semiconductor device according to the first embodiment.

Next, in Step S5, an interlayer insulating film forming step of forming the interlayer insulating film 9 by the CVD method is performed (see FIGS. 9 and 10). When the gate wiring 6 formed in the subsequent process is drawn to the outer peripheral portion of the cell and connected to the gate electrode 10, the gate wiring 6 are insulated from the SiC drift layer 2, the base region 3, and the source region 4 by the interlayer insulating film 9. The thickness of the interlayer insulating film 9 is preferably 1 to 3 μm, which does not affect the gate capacitance and makes the interlayer insulating film 9 less likely to be broken due to switching, surge, or the like. The material of the interlayer insulating film 9 which is an inorganic film is Boro-Phospho Silicate Glass (BPSG), Phospho Silicate Glass (PSG), Tetraethyl orthosilicate (TEOS) or the like. The configuration illustrated in FIG. 8 including the SiC substrate 1, the SiC drift layer 2, the base region 3, and the source region 4 corresponds to the SiC wafer 50 in FIG. 1. The interlayer insulating film 9 corresponds to the inorganic film 90 in FIG. 2.

The interlayer insulating films 9 are formed on the Si surface 13 (that is, the main surface on the source region 4 side) being the upper surface of the SiC wafer 50 and on the C surface 12 (that is, the main surface on the lower surface side of the SiC substrate 1) being the lower surface of the SiC wafer 50. The interlayer insulating film 9 on the C surface 12 is an example of a first inorganic film, and the interlayer insulating film 9 on the Si surface 13 is an example of a second inorganic film.

Next, in Step S6, an etching step is performed. In the etching step of Step S6, the interlayer insulating film 9 on the Si surface 13 side is removed inside the cell by patterning, dry etching, and wet etching, and the interlayer insulating film 9 at a desired position on the Si surface 13 side is also removed on the outer periphery portion of the cell (see FIGS. 9 and 10).

In Step S6, the interlayer insulating film 9 on the Si surface 13 side is etched. At this point, depending on the etching method, the interlayer insulating film 9 on the C surface 12 side of the SiC wafer 50 is also etched, making the interlayer insulating film 9 on the C surface 12 side of the SiC wafer 50 thinner. In the following step, the thickness of the interlayer insulating film 9 on the C surface side of the SiC wafer 50 is preferably 0.75 μm, that is, 750 nm or more. Therefore, in the first embodiment, the etching step of Step S6 is performed in a manner that the remaining thickness of the interlayer insulating film 9 on the C surface 12 side of the SiC wafer 50 is 0.75 μm or more after the etching of Step S6. The reason why it is preferable that the remaining thickness of the interlayer insulating film 9 on the C surface 12 side of the SiC wafer 50 is at least 0.75 μm or more after the etching in Step S6 will be described later. The remaining thickness of the interlayer insulating film 9 on the C surface 12 side of the SiC wafer 50 after the etching in Step S6 may also be 1.2 μm or more, and may be 1.6 μm or more.

In Step S6, for example, the remaining thickness of the interlayer insulating film 9 on the C surface side of the SiC wafer 50 is 0.75 μm or more at the central portion of the SiC wafer 50 in plan view. Further, in Step S6, for example, 0.75 μm or more of the interlayer insulating film 9 is left on the entire C surface side of the SiC wafer 50. Further, in Step S6, for example, 0.75 μm or more of the interlayer insulating film 9 is left on average on the C surface side of the SiC wafer 50. Here, the average thickness of the interlayer insulating film 9 is defined as the average of each thickness measured at a large number of points, for example, 100 points or more evenly arranged in the plane of the SiC wafer 50.

For example, methods for leaving 0.75 μm or more of the interlayer insulating film 9 on the C surface 12 side of the SiC wafer 50 after the etching in Step S6 include a method in which the interlayer insulating film 9 on the C surface 12 side of the SiC wafer 50 is made thicker in advance, a method in which a protective film is formed on the interlayer insulating film 9 on the C surface 12 side of the SiC wafer 50 when performing the process of Step S6 so that the interlayer insulating film 9 on the C surface 12 side of the SiC wafer 50 cannot easily be etched in Step S6, and the like. For example, in the case where the dip method wet etching is performed in Step S6 without forming the protective film, not only the interlayer insulating film 9 on the Si surface 13 side but also the interlayer insulating film 9 on the C surface 12 side is etched. By forming the protective film on the interlayer insulating film 9 on the C surface 12 side of the SiC wafer 50 and then performing the dip method wet etching, the cost can be reduced and, for example, 0.75 μm or more of the interlayer insulating film 9 on the C surface 12 side of the SiC wafer 50 can be left.

Figure 11:
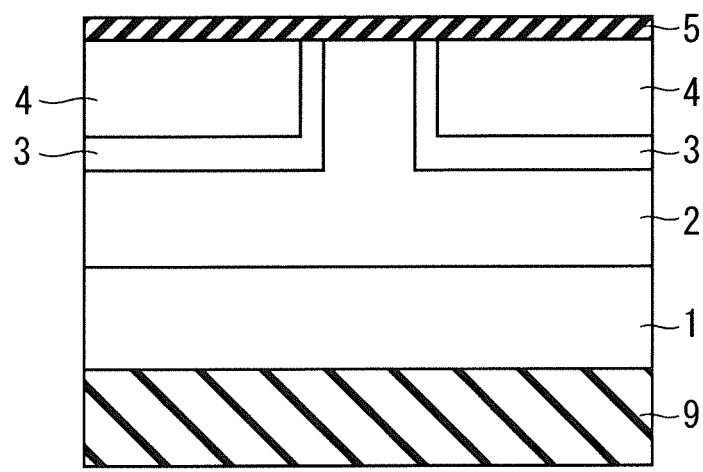
FIG. 11 is a cross-sectional view illustrating a state during manufacturing of the semiconductor device according to the first embodiment.

Next, in Step S7, as illustrated in FIGS. 11 and 12, the gate oxide film 5 which is a thermal oxide film is formed in a region where no interlayer insulating film 9 is formed on the upper surface side of the SiC wafer 50 by the thermal oxidation treatment. In the thermal oxidation treatment, an oxidizing gas, for example, $O_2$ gas or $O_3$ gas, is used as described above. The gate oxide film 5 corresponds to the oxide film 5a in FIG. 2. In FIG. 2, the inorganic film 90 is shown on the lower surface of the SiC wafer 50, and the oxide film 5a is shown on the upper surface of the SiC wafer 50. In Step S7 of the first embodiment, the interlayer insulating film 9 may also be formed on part of the upper surfaces of the SiC wafer 50.

The details of Step S7 will be described below. In Step S7, the gate oxide film 5 is formed by subjecting the SiC wafer 50 to thermal oxidation treatment in the batch type vertical diffusion furnace 80 illustrated in FIG. 1.

In Step S7, first, the SiC wafer 50 in which 0.75 μm or more of the interlayer insulating film 9 is left on the C surface 12 is placed in the batch type vertical diffusion furnace 80 as illustrated in FIG. 1. The SiC wafer 50 and the SiC dummy wafer 51 are placed in a manner that the C surfaces 12 face downward. The illustration of the interlayer insulating film 9 is omitted in FIG. 1.

Next, the Si surface 13 of the SiC wafer 50 is thermally oxidized at 1200° C. or higher and 1300° C. or lower to form a thermal oxide film on the Si surface 13 of the SiC wafer 50. At this point, the gate oxide film 5, which is a thermal oxide film, is formed in the region of the Si surface 13 of the SiC wafer 50 where the interlayer insulating film 9 is not formed (that is, the region where the interlayer insulating film 9 is removed in Step S6). The thicker the interlayer insulating film 9 left on the C surface 12 side of the SiC wafer 50, the more difficult it is for the $O_2$ gas to reach the C surface 12 because of the hampering of the interlayer insulating film 9. Therefore, the amount of $O_2$ gas generated from the C surface 12 due to the reactions of the above equations (1) and (2) is reduced, and the oxidation reaction by the $O_2$ gas is less likely to occur in the SiC wafer 50 directly below the SiC wafer 50.

The thickness of the gate oxide film 5 formed in Step S7 will be described in detail with reference to FIG. 18. FIG. 18 is a graph illustrating the relationship between the thicknesses of the interlayer insulating film 9 formed on the C surface 12 of the SiC wafer 50 and the variation in thickness of the gate oxide films 5 among the SiC wafers 50. The horizontal axis of FIG. 18 represents the average thickness of the interlayer insulating film 9 formed on the C surface 12 of a certain SiC wafer 50. The horizontal axis of FIG. 18 represents the thickness of the interlayer insulating film 9 formed on the C surface 12 of a typical SiC wafer 50, and the interlayer insulating film 9 having substantially the same thickness is formed on the C surface 12 of each SiC wafer 50 in the batch. The vertical axis in FIG. 18 represents a difference between the maximum and minimum thicknesses of the gate oxide films 5 formed on the Si surfaces 13 of the SiC wafers 50 in the batch when the thermal oxidation treatment in Step S7 is performed. In FIG. 18, "Measured Value" mentioned represents a result of measurement conducted following the actual thermal oxidation treatment, and "Calculated Value" represents a result obtained by the numerical simulation. Of each SiC wafer 50 in the batch, the thinnest gate oxide film 5 formed on the Si surface 13 was the SiC wafer 50 directly below the SiC dummy wafer 51.

The results illustrated in FIG. 18 are the results obtained when the thermal oxidation treatment was performed using the batch type vertical diffusion furnace 80 illustrated in FIG. 1. In the thermal oxidation treatment, the gate oxide film 5 having a thickness of about 45 to 50 nm is formed on the upper surface of the SiC wafer 50 having a diameter of 4 inches. Before the thermal oxidation treatment, an interlayer insulating film 9 having a sufficient thickness considered that no $O_2$ gas would be generated by the equations (1) and (2) is formed on the C surface 12 of the SiC dummy wafer 51. On the C surface 12 of the SiC dummy wafer 51, the interlayer insulating film 9 which is an inorganic film is formed thicker than the interlayer insulating film 9 formed on the C surface 12 of each SiC wafer 50 in the batch.

As illustrated in FIG. 18, the thicker the interlayer insulating films 9 formed on the C surface 12 of the SiC wafers 50, the smaller the variation in thickness of the gate oxide films 5 formed in Step S7 among the SiC wafers 50 in the batch becomes. This is because the thicker the interlayer insulating film 9 formed on the C surface 12 of the SiC wafer 50, the more $O_2$ gas generated from the C surface 12 of the SiC wafer 50 due to the reactions represented by the equations (1) and (2) can be suppressed.

The interlayer insulating film 9 having a thickness sufficient enough to deem that there is no $O_2$ gas generated by the equations (1) and (2) is formed on the SiC dummy wafer 51; therefore, when performing Step S7, the same result as in FIG. 18 can be obtained even if the SiC dummy wafer 51 is not placed and the Si monitor wafer 52 is placed directly above the SiC wafer 50. That is, by making the thickness of the interlayer insulating film 9 on the C surface 12 of the SiC wafer 50 0.75 μm or more, even if the SiC dummy wafer 51 is eliminated, the variation in thickness of the gate oxide films 5 among the SiC wafers 50 in the batch is suppressed. Therefore, when the thickness of the interlayer insulating film 9 on the C surface 12 of the SiC wafer 50 is 0.75 μm or more, the SiC wafer 50 may be placed at the position where the SiC dummy wafer 51 is placed in FIG. 1.

As described above, when the thickness of the interlayer insulating film 9 left on the lower surface of the SiC wafer 50 in Step S6 is 0.75 μm or more, the difference in thickness of the gate oxide films 5 formed in Step S7 among the SiC wafers 50 in the batch is suppressed to be 0.8 nm or less. This has been found as a result of diligent research.

Further, when the interlayer insulating film 9 on the C surface 12 of the SiC wafer 50 is thin, the thickness of the interlayer insulating film 9 on the C surface 12 of the SiC wafer 50 is not uniform in the plane, so that the amount of $O_2$ generated is greatly biased depending on the in-plane position. This deteriorates the in-plane uniformity of the gate oxide film 5 of the SiC wafer 50 directly below the SiC wafer 50. If 0.75 μm or more of the interlayer insulating film 9 of the SiC wafer 50 is left, the generation of $O_2$ gas can be suppressed. Therefore, the in-plan uniformity of the gate oxide film 5 formed on the Si surface 13 of the SiC wafer 50 directly below the SiC wafer 50 is improved.

When the thickness of the interlayer insulating film 9 on the C surface 12 of the SiC wafer 50 is made 1.2 μm or more, the difference in the thickness of the gate oxide films 5 among the SiC wafers 50 in the batch can be suppressed to 0.3 nm or less. When the thickness of the interlayer insulating film 9 on the C surface 12 of the SiC wafer 50 is made 1.6 μm or more, the difference in the thickness of the gate oxide films 5 among the SiC wafers 50 in the batch can be suppressed to 0.1 nm or less. Therefore, it is more preferable to leave 1.2 μm of the interlayer insulating film 9 in Step S6, and is even more preferable to leave 1.6 μm of the interlayer insulating film 9 in Step S6.

In Step S7, after the thermal oxide film is formed, post-annealing for reducing the interface state at the interface between $SiO_2$ and SiC is performed with the same wafer placement as in FIG. 1. Post-annealing is carried out under a wet atmosphere, a nitrogen oxide (NO or $N_2O$) atmosphere, an oxidation gas atmosphere such as a $POCl_3$ atmosphere, or a reducing gas atmosphere such as $H_2$ gas or $NH_3$ gas.

Then, in Step S8, the gate wiring 6 is formed on the gate oxide film 5. The gate wiring 6 is formed by forming a polycrystalline silicon film having conductivity by the reduced pressure CVD method and then patterning the polycrystalline silicon film. After that, an interlayer insulating film 9 having a thickness of about 1.0 to 3.0 μm is additionally formed by a CVD apparatus to cover the gate wiring 6.

Figure 14:
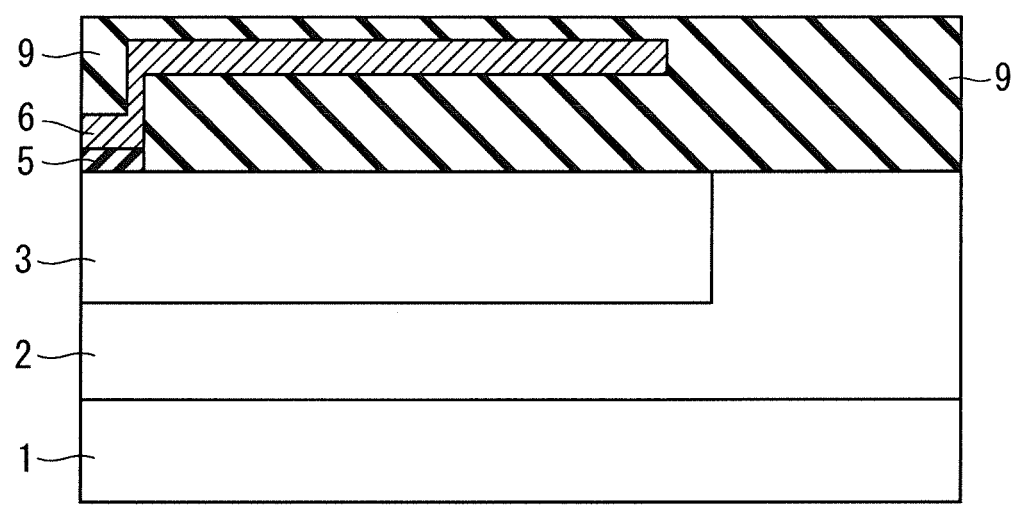
FIG. 14 is a cross-sectional view illustrating a state during manufacturing of the semiconductor device according to the first embodiment.
Figure 15:
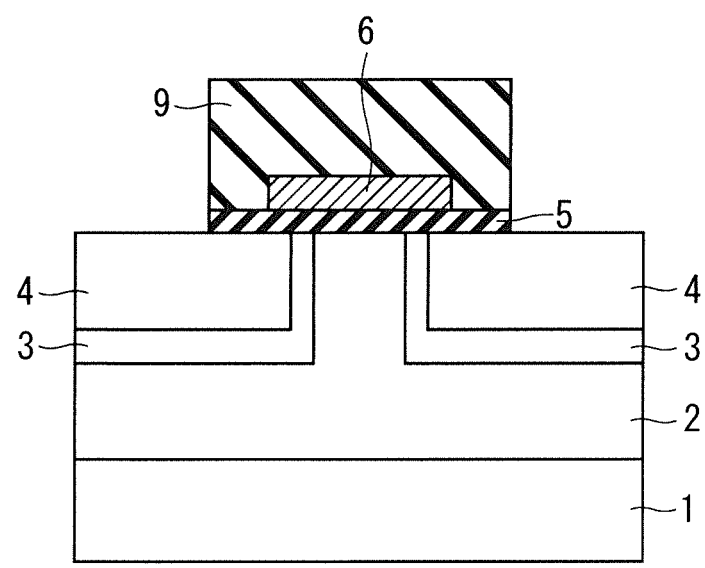
FIG. 15 is a cross-sectional view illustrating a state during manufacturing of the semiconductor device according to the first embodiment.

Then, in Step S9, the interlayer insulating film 9 and the polycrystalline silicon film on the lower surface of the SiC wafer 50 are removed by wet etching or dry etching. With this, the states illustrated in FIGS. 13 and 14 are obtained.

Next, in Step S10, the source electrode 7 and the gate electrode 10 are formed.

In Step S10, first, the interlayer insulating film 9 in the region where the source electrode 7 is formed is removed by patterning and dry etching. Further, after forming a silicide layer in the region where the source electrode 7 is to be formed, the interlayer insulating film 9 in the region for making contact with the gate wiring 6 is removed by patterning and dry etching (see FIGS. 15 and 16). Next, the source electrode 7 electrically connected to the source region 4 and the gate electrode 10 electrically connected to the gate wiring 6 are formed. The source electrode 7 and the gate electrode 10 are formed by forming a film such as an Al alloy on the entire upper surface of the SiC wafer 50 by a sputtering method, and then arrange the shape of the film by patterning and wet etching.

Next, in Step S11, the drain electrode 8 is formed on the lower surface side of the SiC wafer 50. The material of the drain electrode 8 is, for example, an Al alloy.

Through above Steps, the vertical MOSFET 100 illustrated in FIGS. 4 and 5 is completed.

The manufacturing method of the silicon carbide semiconductor device of the first embodiment described above is summarized as follows. A plurality of SiC wafers 50 are prepared, interlayer insulating films 9 which are first inorganic films are formed on the lower surfaces of the plurality of SiC wafers 50, and the plurality of SiC wafers 50 are etched after the formation of the first inorganic films. The etching is performed so that the remaining thickness of the first inorganic films of the plurality of SiC wafers 50 is 0.75 μm or more after the etching. Next, in Step S7, the gate oxide films 5 are formed on the upper surfaces of the plurality of SiC wafers 50 by performing thermal oxidation treatment using the batch type vertical diffusion furnace 80. The thermal oxidation treatment is performed in a state in which at least one wafer, which is including at least one of the Si monitor wafer 52 or the SiC dummy wafer 51 and which is different from the plurality of SiC wafers 50, and the plurality of SiC wafers 50 are aligned in one direction and the upper surfaces of the plurality of SiC wafers 50 are oriented in one direction. In the state of thermal oxidation treatment, a first SiC wafer 50 of the plurality of SiC wafers 50 is placed directly below any one of the at least one wafer including at least one of the Si monitor wafer 52 and the SiC dummy wafer 51, and a second SiC wafer 50 of the plurality of SiC wafers 50 is placed directly below a third SiC wafer 50 of the plurality of SiC wafers 50.

In Step S7, that the thickness of the interlayer insulating films 9 on the C surface 12 side of the SiC wafers 50 is 0.75 μm or more suppresses the gas generated from the C surfaces 12 of the SiC wafers 50, so that the thicknesses of the gate oxide films 5 are made uniform among the SiC wafers 50 in the batch. Further, the gas generated from the C surfaces 12 of the SiC wafers 50 is suppressed; therefore, the SiC dummy wafer 51 can be eliminated.

The same configuration as Step S7 of the manufacturing method of the first embodiment is adoptable to another step of performing heat treatment with a batch type apparatus such as a heat treatment step of a metal electrode. Further, the same configuration as in Step S7 is adoptable to the step of forming an oxide film other than the gate oxide film 5.

B. Second Embodiment

FIG. 19 is a diagram illustrating how wafers are placed in the batch type vertical diffusion furnace 80 in Step S7 (see FIG. 17) of the method of manufacturing a semiconductor device according to the second embodiment. In Step S7 of the second embodiment, the SiC wafers 50 and the Si dummy wafers 51a are alternately placed on the boat 82. Except for this configuration, the method of manufacturing the semiconductor device according to the second embodiment is the same as the method of manufacturing the semiconductor device according to the first embodiment.

By placing the wafers as illustrated in FIG. 19, the diffusion of $O_2$ gas generated from the C surfaces 12 of the SiC wafers 50 is blocked by the Si dummy wafers 51a installed immediately below the C surfaces 12. The amount of $O_2$ gas that reaches the other SiC wafers 50 by diffusion is reduced. Therefore, in the SiC wafers 50 directly below the Si dummy wafers 51a, oxidation by $O_2$ gas generated from the C surfaces 12 of the other SiC wafers 50 is less likely to occur, and the variation of the thicknesses of the gate oxide films 5 among the SiC wafers 50 in the batch is suppressed.

Further, the generation of $O_2$ gas is suppressed; therefore, the in-plane uniformity of the thickness of the gate oxide film 5 formed on the Si surface 13 of each SiC wafer 50 in the batch is improved in Step S7. Instead of the Si dummy wafers 51a, other dummy wafers that are less likely to generate $O_2$ gas on the lower surfaces thereof and less likely to cause a non-uniform oxidation reaction on the SiC wafers 50 directly below thereof may be used. The other dummy wafers are, for example, SiC dummy wafers 51 having an inorganic film having a thickness of 0.75 μm or more formed on the lower surfaces thereof.

If 0.75 μm or more of the interlayer insulating film 9 is left on the lower surface of the SiC wafer 50, the amount of $O_2$ gas generated from the lower surface of the SiC wafer 50 decreases in Step S7; therefore, the amount of $O_2$ gas that detours the Si dummy wafers 51a and diffuses to other SiC wafers 50 is also reduced, and the variation of the thicknesses of the gate oxide films 5 among the SiC wafers 50 in the batch can be suppressed with higher accuracy.

C. Third Embodiment

Figure 20:
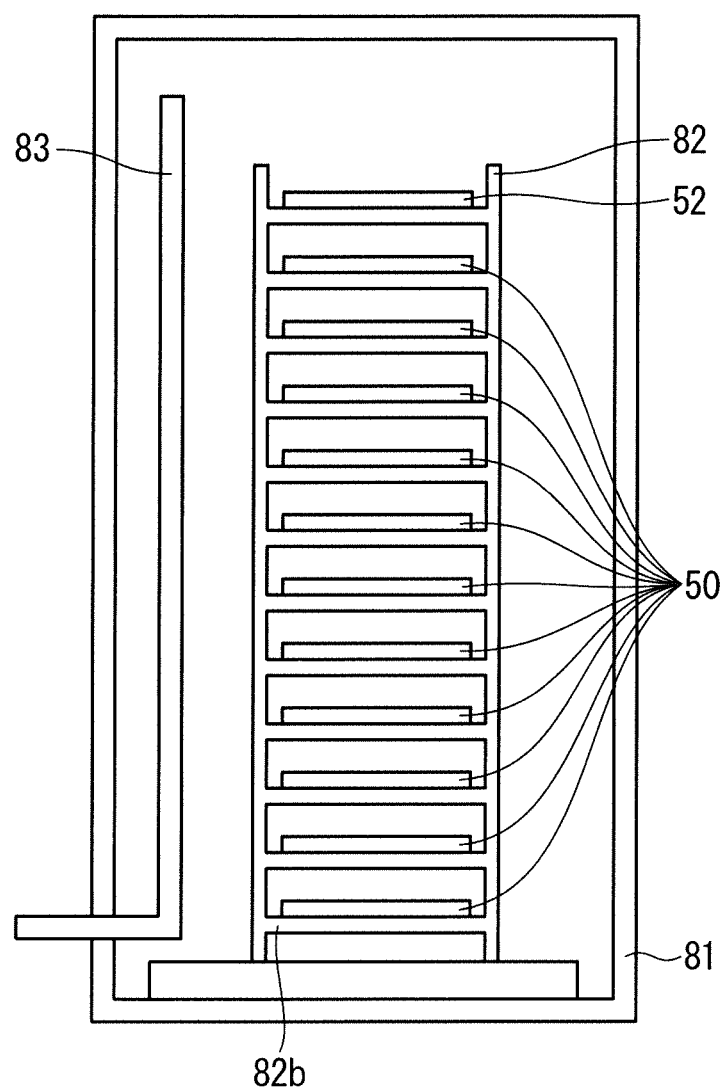
FIG. 20 is a diagram illustrating a batch type vertical diffusion furnace according to the third embodiment.

FIG. 20 is a diagram illustrating a configuration of a batch type vertical diffusion furnace 80c used in the third embodiment. The method of manufacturing a semiconductor device of the third embodiment is different from the method of manufacturing the semiconductor device of the first embodiment in that the batch type vertical diffusion furnace 80c is used in Step S7 (see FIG. 17) instead of the batch type vertical diffusion furnace 80. Although FIG. 20 illustrates a case where the SiC dummy wafer 51 is not used, also in the third embodiment, the SiC dummy wafer 51 may be placed between the Si monitor wafer 52 and the SiC wafer 50 as in the case of the first embodiment. Except for this configuration, the method of manufacturing the semiconductor device according to the third embodiment is the same as the method of manufacturing the semiconductor device according to the first embodiment.

Compared with the batch type vertical diffusion furnace 80 used in the first and second embodiments, the batch type vertical diffusion furnace 80c of the third embodiment includes support portions 82b instead of the support portions 82a. The batch type vertical diffusion furnace 80c is otherwise similar to the batch type vertical diffusion furnace 80.

In the batch type vertical diffusion furnace 80 of the first embodiment, the support portions 82a of the boat 82 are claw-shaped, only the end portions of the wafer are in contact with the support portions 82a, and the wafer is supported by the support portions 82a with the central portion of thereof not overlapping the support portions 82a in plan view.

On the other hand, in the batch type vertical diffusion furnace 80c of the third embodiment, the support portions 82b are plate-shaped. The SiC wafer 50 is placed on the plate-shaped support portion 82b with the C surface 12 facing downward. For example, the SiC wafer 50 is placed on the plate-shaped support portion 82b so as to overlap the plate-shaped support portion 82b as a whole in plan view. The SiC wafer 50 is placed on the plate-shaped support portion 82b, for example, in a state of being in contact with the support portion 82b in a part including the center of the SiC wafer 50 or the entire SiC wafer 50 in plan view.

In the batch type vertical diffusion furnace 80c, a certain SiC wafer 50 is partitioned from a SiC wafer 50 directly below the certain SiC wafer 50 by the plate-shaped support portions 82b. Therefore, the diffusion of the $O_2$ gas generated due to the reactions of the equations (1) and (2) from the C surface 12 of the certain SiC wafer 50 to the SiC wafer 50 directly below the certain SiC wafer 50 is suppressed, and excessive oxidation reaction by $O_2$ gas in the SiC wafer 50 directly below the certain SiC wafer 50 is suppressed. In the batch type vertical diffusion furnace 80c, for example, the SiC wafers 50 adjacent to each other are partitioned by a plate-shaped support portion 82b.

As described above, by using the batch type vertical diffusion furnace 80c, the variation in thickness of the gate oxide films 5 among the SiC wafers 50 in the batch is suppressed. Furthermore, the influence of $O_2$ gas generated due to the reactions of equations (1) and (2) is suppressed; therefore, the in-plane uniformity of the thickness of the gate oxide film 5 formed on the Si surface 13 of each SiC wafer 50 in the batch is improved.

If 0.75 μm or more of the interlayer insulating film 9 is left on the lower surface of the SiC wafer 50 in Step S6 (see FIG. 17), the amount $O_2$ gas generated from the lower surface of the SiC wafer 50 in Step S7 (see FIG. 17) decreases. Therefore, the $O_2$ gas that detours and diffuses around the plate-shaped support portions 82b is reduced, the variation in thickness of the gate oxide films 5 among the SiC wafers 50 in the batch is suppressed with higher accuracy.

D. Fourth Embodiment

Figure 21:
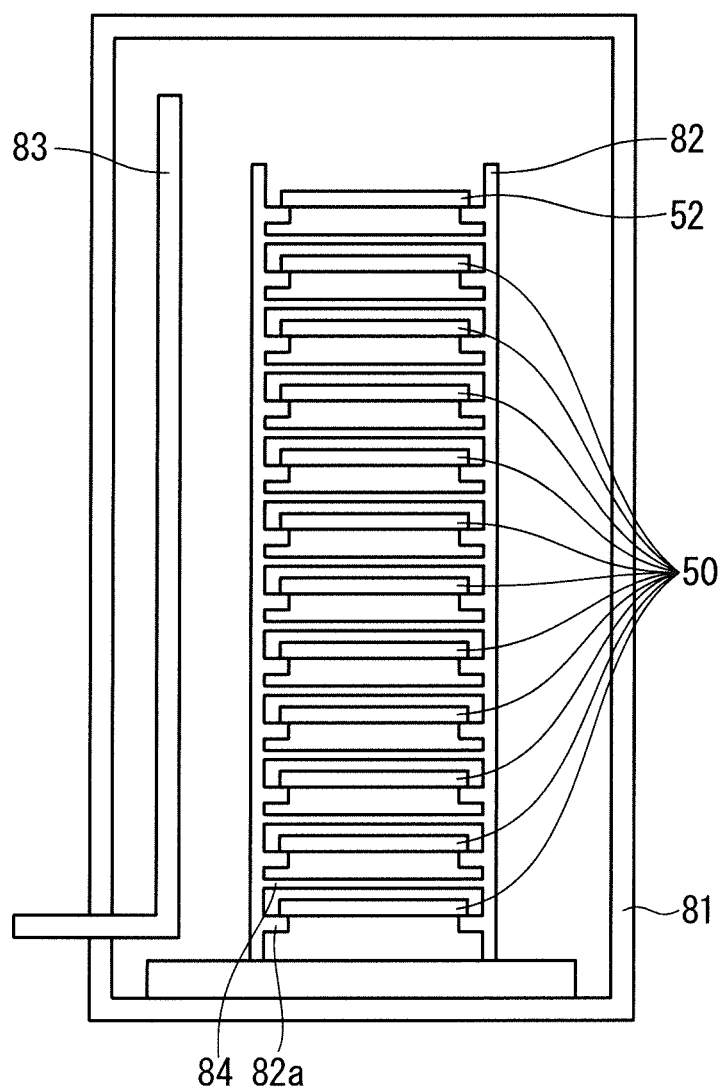
FIG. 21 is a diagram illustrating a batch type vertical diffusion furnace according to the fourth embodiment.

FIG. 21 is a diagram illustrating a configuration of a batch type vertical diffusion furnace 80d used in the fourth embodiment. The method of manufacturing a semiconductor device of the fourth embodiment is different from the method of manufacturing the semiconductor device of the first embodiment in that the batch type vertical diffusion furnace 80d is used in Step S7 (see FIG. 17) instead of the batch type vertical diffusion furnace 80. Although FIG. 21 illustrates a case where the SiC dummy wafer 51 is not used, also in the third embodiment, the SiC dummy wafer 51 may be placed between the Si monitor wafer 52 and the SiC wafer 50 as in the case of the first embodiment. Except for this configuration, the method of manufacturing the semiconductor device according to the fourth embodiment is the same as the method of manufacturing the semiconductor device according to the first embodiment.

Compared with the batch type vertical diffusion furnace 80 used in the first and second embodiments, the batch type vertical diffusion furnace 80d of the fourth embodiment further includes partitions 84. The batch type vertical diffusion furnace 80d is otherwise similar to the batch type vertical diffusion furnace 80.

In the batch type vertical diffusion furnace 80d, a wafer supported by a certain support portion 82a and a wafer supported by a support portion 82a in the adjacent stage are partitioned by a partition 84. In the batch type vertical diffusion furnace 80c, for example, the SiC wafers 50 adjacent to each other are partitioned by the plate-shaped support portion 84b.

The partition 84 suppresses the diffusion of $O_2$ gas generated from the lower surface of the SiC wafer 50 into the SiC wafer 50 directly below the SiC wafer 50 in Step S7, oxidation reaction by $O_2$ gas in the SiC wafer 50 directly below the SiC wafer 50 is suppressed. As a result, the variations in the thickness of the gate oxide film 5 among the SiC wafers 50 in the batch is suppressed. Further, the diffusion of $O_2$ gas is suppressed; therefore, the in-plane uniformity of the thickness of the gate oxide film 5 on the Si surface 13 in each SiC wafer 50 in the batch is improved.

If 0.75 μm or more of the interlayer insulating film 9 is left on the lower surface of the SiC wafer 50 in Step S6 (see FIG. 17), the amount $O_2$ gas generated from the lower surface of the SiC wafer 50 in Step S7 (see FIG. 17) decreases. Therefore, the $O_2$ gas that detours and diffuses around the partitions 82b is reduced, the variation in thickness of the gate oxide films 5 among the SiC wafers 50 in the batch is suppressed with higher accuracy.

In order to prevent the gas generated from the SiC wafer 50 from detouring and diffusing around the partition 84, it is desirable that the size of the partition 84 is equal to or larger than the size of the wafer. For example, in Step S7 (see FIG. 17), the SiC wafer 50 is supported by the support portion 82a in such a placement that the entire SiC wafer 50 overlaps the partition 84 in plan view.

The partitions 84 may be integrated with the boat 82 or may be removable from the boat 82.

If the partitions 84 are removable from the boat 82, the boat 82 can be easily handled, and the batch type vertical diffusion furnace 80d can be easily installed and maintained.

E. Fifth Embodiment

Figure 22:
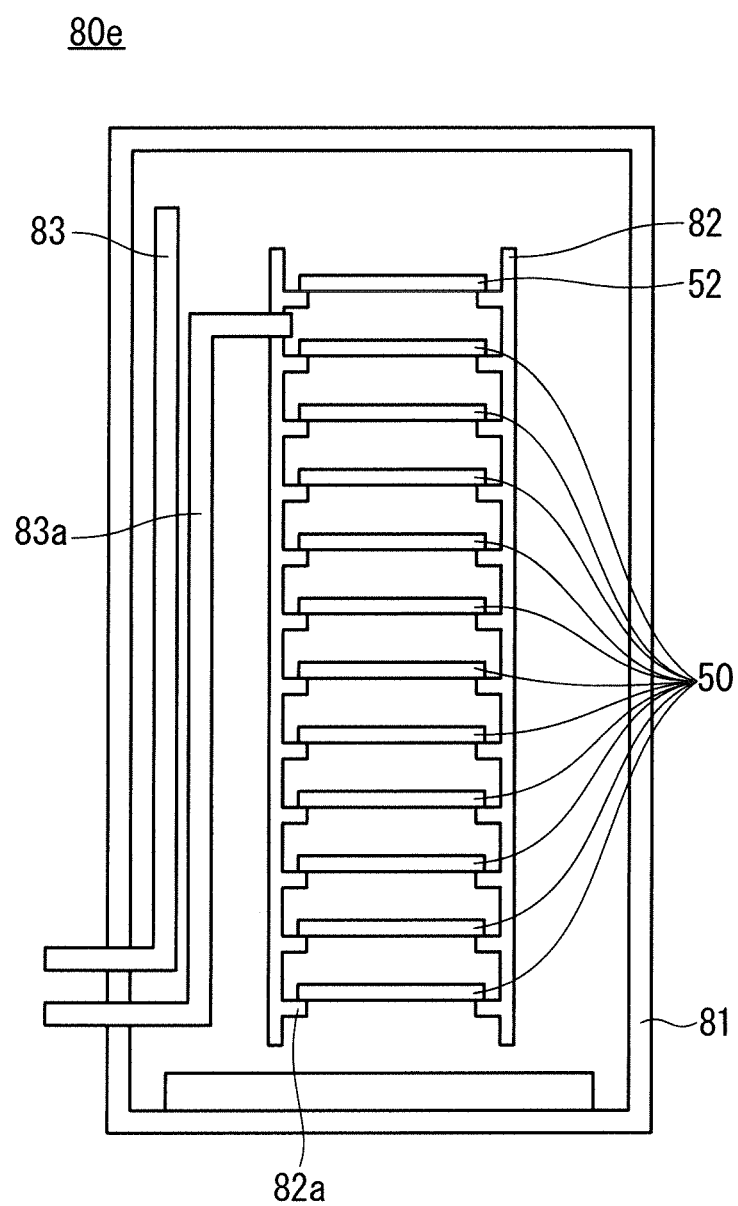
FIG. 22 is a diagram illustrating a batch type vertical diffusion furnace according to the fifth embodiment.

FIG. 22 is a diagram illustrating a configuration of the batch type vertical diffusion furnace 80e used in the fifth embodiment and the placement of wafers in Step S7 (see FIG. 17). The method of manufacturing a semiconductor device of the fifth embodiment is different from the method of manufacturing the semiconductor device of the first embodiment in that the batch type vertical diffusion furnace 80e is used in Step S7 instead of the batch type vertical diffusion furnace 80. FIG. 22 illustrates a case where the SiC dummy wafer 51 is not used. Except for this configuration, the method of manufacturing the semiconductor device according to the fifth embodiment is the same as the method of manufacturing the semiconductor device according to the first embodiment.

Compared with the batch type vertical diffusion furnace 80 used in the first and second embodiments, the batch type vertical diffusion furnace 80e is different in that the gas introduction line 83a is provided in addition to the gas introduction line 83. With the use of the gas introduction line 83a, the batch type vertical diffusion furnace 80e is capable of supplying more $O_2$ gas or $O_3$ gas to a region between a set of support portions 82a adjacent in the direction in which a plurality of wafers are stacked, than it supplies $O_2$ gas or $O_3$ gas to a region between another set of support portions 82a adjacent in the direction in which the plurality of wafers are stacked.

In the method of manufacturing the semiconductor device of the fifth embodiment, in Step S7 (see FIG. 17), $O_2$ gas or $O_3$ gas is selectively supplied between the Si monitor wafer 52 and the SiC wafer 50 through the gas introduction line 83a in addition to oxygen being supplied through the gas introduction line 83. With this, more $O_2$ or $O_3$ gas is supplied to the region between the Si monitor wafer 52 and the SiC wafer 50 than to the region between the SiC wafers 50. When a dummy wafer is used in Step S7 (see FIG. 17), $O_2$ gas or $O_3$ gas is supplied to the region between the dummy wafer and the SiC wafer 50 through the gas introduction line 83a. With this, more $O_2$ or $O_3$ gas is supplied to the region between the dummy wafer and the SiC wafer 50 than to the region between the SiC wafers 50.

As mentioned above, in the results illustrated in FIG. 18 of the first embodiment, the gate oxide film 5 formed on the SiC wafer 50 placed directly below the monitor wafer or the dummy wafer in Step S7 (see FIG. 17) is thinner than the gate oxide film 5 formed on the SiC wafer 50 placed directly below the SiC wafer 50 in Step S7 (see FIG. 17).

In the method of manufacturing the semiconductor device of the fifth embodiment, $O_2$ gas or $O_3$ gas is preferentially supplied from the gas introduction line 83a to the upper surface of the SiC wafer 50 placed directly below the monitor wafer or the dummy wafer, and this causes the oxidation reaction by the $O_2$ or $O_3$ easily on the upper surface of the SiC wafer 50 placed directly below the monitor wafer or the dummy wafer. Therefore, the variation in thickness of the gate oxide film 5 among the SiC wafers 50 in the batch is suppressed.

Figure 23:
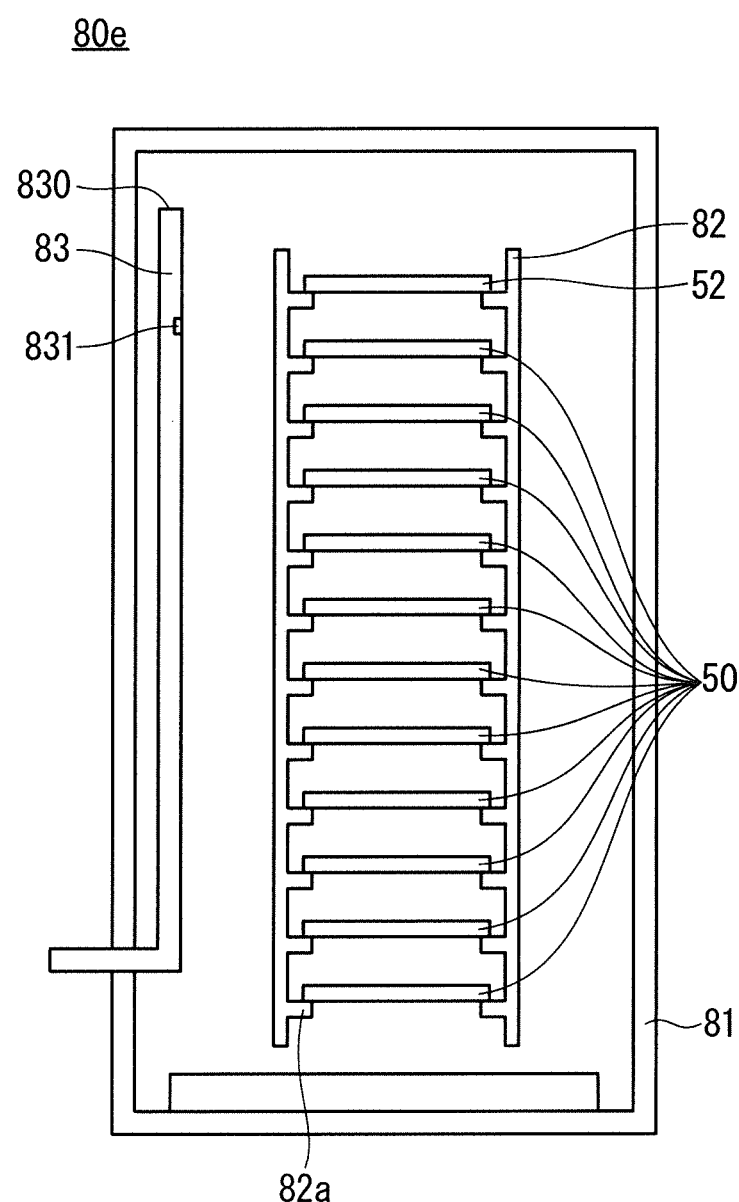
FIG. 23 is a diagram illustrating a batch type vertical diffusion furnace according to the fifth embodiment.

The batch type vertical diffusion furnace 80e may not include the gas introduction line 83a. In that case, as illustrated in FIG. 23, the gas introduction line 83 is provided with an opening 831 on the side surface in addition to an opening 830 in the tube 81. By supplying $O_2$ gas or $O_3$ gas from the opening 831 preferentially to the region between the monitor wafer and the SiC wafer 50 placed directly below the monitor wafer, or to the region between the dummy wafer and the SiC wafer 50 placed directly below the dummy wafer, the variation in thickness of the gate oxide film 5 among the SiC wafers 50 in the batch is suppressed.

Although it has been described in the first embodiment that if 0.75 μm or more of the interlayer insulating film 9 is left on the lower surface of the SiC wafer 50 in Step S6 (see FIG. 17), the difference in thickness of the gate oxide films 5 among the SiC wafers 50 in the batch in step S7 can be suppressed to 0.8 nm or less, the variation in thickness of the gate oxide films 5 among the SiC wafers 50 in the batch is suppressed with higher accuracy using the fifth embodiment together. In that case, in Step S7 (see FIG. 17), the amount of oxidizing gas supplied from the gas introduction line 83a is adjusted according to the thickness of the interlayer insulating film 9 formed on the lower surface of the SiC wafer 50. When the SiC dummy wafer 51 is placed between the SiC wafer 50 and the Si monitor wafer 52, the amount of oxidizing gas supplied from the gas introduction line 83a is adjusted according to the thickness of the interlayer insulating film 9 formed on the lower surface of the SiC wafer 50 and the thickness of the interlayer insulating film 9 formed on the lower surface of the SiC dummy wafer 51 in Step S7 (see FIG. 17).

In the present disclosure, the embodiments can be combined, appropriately modified or omitted, without departing from the scope of the disclosure.

What is claimed is:

1. A semiconductor manufacturing apparatus configured to perform thermal oxidation treatment, comprising:
   a container in which the thermal oxidation treatment is configured to be performed; and
   a plurality of support portions configured to support a plurality of wafers along one direction with main surfaces of the plurality of wafers oriented in the one direction; and
   an introduction line in the container that is configured to supply more oxygen gas or ozone gas to a region between support portions of a first set of the plurality of support portions adjacent in the one direction, than to a region between support portions of a second set of the plurality of support portions, being a set adjacent in the one direction, different from the first set, wherein
   the introduction line has an opening that is positioned between the first set of the plurality of support portions in the one direction, and the introduction line extends between the support portions in a second direction perpendicular to the one direction.

2. The semiconductor manufacturing apparatus according to claim 1, further comprising
   an other introduction line through which oxygen gas or ozone gas is introduced into the container, wherein
   the introduction line is configured to selectively introduce oxygen gas or ozone gas to the region between support portions of the first set of the plurality of support portions adjacent in the one direction.

3. The semiconductor manufacturing apparatus according to claim 1, wherein
   at a central portion in plan view of a set of wafers supported by a set of support portions, of the plurality of support portions, adjacent in the one direction, any of the set of support portions is configured to partition between the wafers of the set such that the any of the set of support portions is positioned directly between centers of two of the wafers in the one direction, and
   the support portions are an integral structure of the semiconductor manufacturing apparatus.

4. The semiconductor manufacturing apparatus according to claim 1, wherein
   at a central portion in plan view of a set of wafers supported by a set of support portions, of the plurality of support portions, adjacent in the one direction, a partition, different from any of the set of support portions, is configured to partition a space between the wafers of the set such that the partition is positioned directly between centers of two of the wafers of the set in the one direction, and
   the partition and the support portions are an integral structure of the semiconductor manufacturing apparatus.

* * * * *